US009842888B2

(12) United States Patent
Jeong et al.

(10) Patent No.: US 9,842,888 B2
(45) Date of Patent: Dec. 12, 2017

(54) ORGANIC LIGHT EMITTING DISPLAY DEVICE AND METHOD OF MANUFACTURING THE SAME

(71) Applicant: SAMSUNG DISPLAY CO., LTD., Yongin, Gyeonggi-Do (KR)

(72) Inventors: Jin-Wook Jeong, Asan-si (KR); Han-Ggoch-Nu-Ri Jo, Cheonan-si (KR); Sang-Yeol Kim, Hwaseong-si (KR)

(73) Assignee: SAMSUNG DISPLAY CO., LTD, Yongin, Gyeonggi-Do (KR)

( * ) Notice: Subject to any disclaimer, the term of this patent is extended or adjusted under 35 U.S.C. 154(b) by 13 days.

(21) Appl. No.: 14/804,558

(22) Filed: Jul. 21, 2015

(65) Prior Publication Data

US 2016/0099294 A1 Apr. 7, 2016

(30) Foreign Application Priority Data

Oct. 2, 2014 (KR) .................. 10-2014-0133150

(51) Int. Cl.
*H01L 27/32* (2006.01)
*H01L 51/00* (2006.01)
(Continued)

(52) U.S. Cl.
CPC ........ *H01L 27/3218* (2013.01); *H01L 27/326* (2013.01); *H01L 27/3213* (2013.01);
(Continued)

(58) Field of Classification Search
CPC ............ H01L 27/3276; H01L 27/3248; H01L 51/5221; H01L 51/56; H01L 51/5012;
(Continued)

(56) References Cited

U.S. PATENT DOCUMENTS

2004/0257473 A1* 12/2004 Miyagawa ............. H04N 7/144
348/571
2008/0026543 A1* 1/2008 Miyairi ............... H01L 27/1266
438/455
(Continued)

FOREIGN PATENT DOCUMENTS

EP 2672541 A2 12/2013
KR 10-2010-0015176 A 2/2010
(Continued)

OTHER PUBLICATIONS

European Search Report dated Feb. 26, 2016.
European Communication dated Jun. 23, 2017 in the corresponding European Patent Application No. 15188253.7.

*Primary Examiner* — Caridad Everhart
(74) *Attorney, Agent, or Firm* — Lee & Morse P.C.

(57) ABSTRACT

An organic light emitting display device includes a substrate having a first width in a first direction and a second width in a second direction, the second width being perpendicular to and smaller than the first width, and pixel regions on the substrate, each of the pixel regions including a first light emitting portion, a second light emitting portion, a third light emitting portion, and a transmission portion arranged along the second direction, each of the first to third light emitting portions extending in the first direction.

25 Claims, 37 Drawing Sheets

(51) Int. Cl.
*H01L 51/52* (2006.01)
*H01L 51/56* (2006.01)
*H01L 51/50* (2006.01)

(52) U.S. Cl.
CPC ...... *H01L 27/3216* (2013.01); *H01L 27/3248* (2013.01); *H01L 27/3276* (2013.01); *H01L 51/0013* (2013.01); *H01L 51/5221* (2013.01); *H01L 51/56* (2013.01); *H01L 51/0077* (2013.01); *H01L 51/0097* (2013.01); *H01L 51/5012* (2013.01); *H01L 2227/323* (2013.01); *H01L 2251/301* (2013.01); *H01L 2251/5338* (2013.01)

(58) Field of Classification Search
CPC ....... H01L 2251/301; H01L 2251/5338; H01L 27/326; H01L 27/3216; H01L 27/3213; H01L 51/0013; H01L 51/0077; H01L 51/0097; H01L 27/3211; H01L 2227/323
See application file for complete search history.

(56) References Cited

U.S. PATENT DOCUMENTS

| | | |
|---|---|---|
| 2010/0096988 A1 | 4/2010 | Kitabayashi et al. |
| 2011/0050645 A1 | 3/2011 | Lee et al. |
| 2011/0148944 A1* | 6/2011 | Kobayashi ........... G09G 3/3225 345/690 |
| 2011/0186846 A1 | 8/2011 | Ha et al. |
| 2011/0205198 A1 | 8/2011 | Jeong et al. |
| 2011/0316413 A1* | 12/2011 | Ghosh ................. H01L 51/5284 313/498 |
| 2012/0301986 A1 | 11/2012 | Choi et al. |
| 2013/0082589 A1* | 4/2013 | So ....................... H01L 51/5036 313/504 |
| 2013/0113843 A1* | 5/2013 | Yamazaki ............. H01L 27/326 345/690 |
| 2014/0014919 A1 | 1/2014 | Na |
| 2014/0077186 A1* | 3/2014 | Kim .................... H01L 27/3218 257/40 |
| 2014/0077688 A1* | 3/2014 | Weaver ............... H01L 51/5004 313/504 |
| 2014/0110681 A1 | 4/2014 | Hack et al. |
| 2014/0285914 A1* | 9/2014 | Sakano .................... G02B 5/20 359/892 |
| 2015/0346866 A1* | 12/2015 | Kusunoki ............... G06F 3/044 345/174 |

FOREIGN PATENT DOCUMENTS

| | | |
|---|---|---|
| KR | 10-2011-0020089 A | 3/2011 |
| KR | 10-2013-0071543 A | 7/2013 |

* cited by examiner

FIG. 25
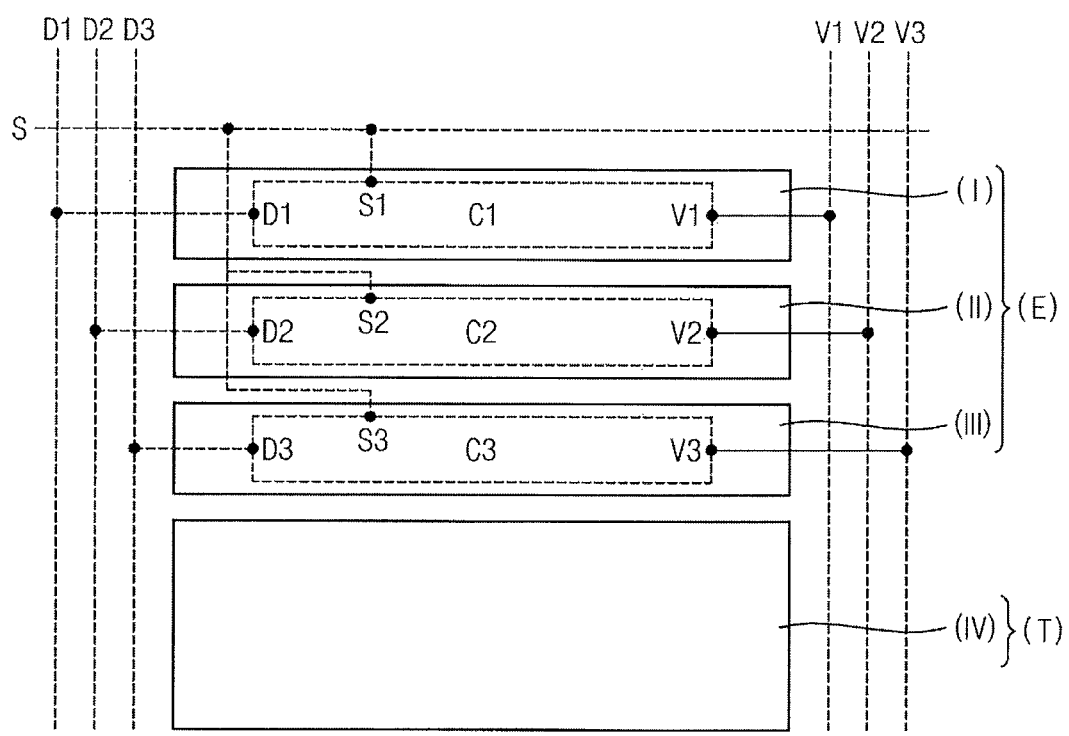
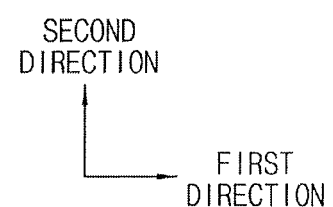

ORGANIC LIGHT EMITTING DISPLAY DEVICE AND METHOD OF MANUFACTURING THE SAME

CROSS-REFERENCE TO RELATED APPLICATION

Korean Patent Application No. 10-2014-0133150, filed on Oct. 2, 2014, in the Korean Intellectual Property Office, and entitled: "Organic Light Emitting Display Device and Method of Manufacturing The Same," is incorporated by reference herein in its entirety.

BACKGROUND

1. Field

Example embodiments relate to an organic light emitting display device and a method of manufacturing the same. More particularly, example embodiments relate to an organic light emitting display device having an improved transmittance for an external light and a method of manufacturing the same.

2. Description of the Related Art

Displays include a plurality of pixels which emit light to form an image. The pixels of OLED displays include an organic light emitting diode (OLED). The OLEDs emit light having a wavelength that depends on the type of organic material included in the light-emitting layer of the OLED. For example, the OLEDs can include different types of organic materials in order to emit one of a red, green and blue colored light. The OLED displays mixed light having different colors emitted by the OLEDs to form a color image. Recently, OLED displays having a predetermined transmittance have been studied.

SUMMARY

Example embodiments provide an organic light emitting display device manufactured by a simplified method.

Example embodiments provide a simplified method of manufacturing an organic light emitting display device.

According to example embodiments, an organic light emitting display device includes a substrate having a first width in a first direction and a second width in a second direction substantially perpendicular to the first direction, the first width being greater than the second width, and a plurality of pixel regions disposed on the substrate, each of the plurality of pixel regions being divided into a first region and a second region, each of the plurality of pixel regions including a first light emitting portion, a second light emitting portion, a third light emitting portion and a transmission portion arranged along the second direction, and each of the first light emitting portion, the second light emitting portion and the third light emitting portion extending in the first direction, wherein the first light emitting portion, the second light emitting portion, and the third light emitting portion are disposed in the first region of each of the pixel regions, and the transmission portion is disposed in the second region of each of the pixel regions.

In example embodiments, the organic light emitting display device may further include a plurality of first lower electrodes disposed in the first light emitting portions, a plurality of second lower electrodes disposed in the second light emitting portions and a plurality of third lower electrodes disposed in the third light emitting portions.

In example embodiments, the organic light emitting display device may further include a first organic light emitting layer pattern disposed on the plurality of the first lower electrodes, a second organic light emitting layer pattern disposed on the plurality of the second lower electrodes, and a third organic light emitting layer pattern disposed on the plurality of the third lower electrodes. The first organic light emitting layer pattern may extend in the first direction, the second organic light emitting layer pattern may extend in the first direction, and the third organic light emitting layer pattern may extend in the first direction.

In example embodiments, the first organic light emitting layer pattern may cover the first light emitting portions, and may exposure the transmission portions. The second organic light emitting layer pattern may cover the second light emitting portions, and may exposure the transmission portions. The third organic light emitting layer pattern may cover the third light emitting portions, and may exposure the transmission portions.

In example embodiments, the organic light emitting display device may further include an upper electrode disposed on the first organic light emitting layer pattern, the second organic light emitting layer pattern and the third organic light emitting layer pattern. The upper electrode may cover the first light emitting portions, the second light emitting portions, the third light emitting portions and the transmission portions.

In example embodiments, the organic light emitting display device may further include an upper electrode disposed on the first organic light emitting layer pattern, the second organic light emitting layer pattern and the third organic light emitting layer pattern. The upper electrode may cover the first light emitting portions, the second light emitting portions and the third light emitting portions, and may exposure the transmission portions.

In example embodiments, the upper electrode may include aluminum (Al), platinum (Pt), silver (Ag), magnesium (Mg), gold (Au), chromium (Cr), tungsten (W), molybdenum (Mo), titanium (Ti) or an alloy thereof.

In example embodiments, the organic light emitting display device may further include an organic layer pattern covering the transmission portions. The organic layer pattern may have a relatively low adhesive characteristic with respect to the upper electrode.

In example embodiments, the organic layer pattern may include lithium quinoline.

In example embodiments, the transmission portions do not overlap the first light emitting portion, the second light emitting portion and the third light emitting portion in the first direction.

In example embodiments, a length of the first light emitting portion in the first direction may be substantially greater than a width of the first light emitting portion in the second direction. A length of the second light emitting portion in the first direction may be substantially greater than a width of the second light emitting portion in the second direction. A length of the third light emitting portion in the first direction may be substantially greater than a width of the third light emitting portion in the second direction.

In example embodiments, the organic light emitting display device may further include a first pixel circuit disposed in the first light emitting portion, a second pixel circuit disposed in the second light emitting portion and a third pixel circuit disposed in the third light emitting portion. The first pixel circuit may be electrically connected to the first lower electrode, the second pixel circuit may be electrically connected to the second lower electrode, and the third pixel circuit may be electrically connected to the third lower electrode.

In example embodiments, the organic light emitting display device may further include a driving circuit disposed in an edge of the substrate and a plurality of wirings electrically connecting the driving circuit with the first pixel circuit, the second pixel circuit or the third pixel circuit.

In example embodiments, the wirings may include a scan line, a data line and a Vdd line.

In example embodiments, the scan line may extend in the second direction, and the data line and the Vdd line may extend in the first direction.

In example embodiments, the scan line may extend in the first direction. The data line and the Vdd line may extend in the second direction.

In example embodiments, the organic light emitting display device can be bent about an axis extending in the second direction.

In example embodiments, the first organic light emitting layer pattern, the second organic light emitting layer pattern and the third light emitting layer pattern may not be disposed in the transmission portion.

According to example embodiments, an organic light emitting display device includes a substrate and a plurality of pixel regions disposed on the substrate. The substrate has a first width in a first direction and a second width in a second direction substantially perpendicular to the first direction, and the first width is greater than the second width. Each of the pixel regions is divided into a first region and a second region. Each of the pixel regions includes a first emitting portion, a second emitting portion, a third emitting portion and a transmission portion arranged along the first direction. Each of the first emitting portion, the second emitting portion and the third emitting portion extends in the second direction. The first light emitting portion, the second light emitting portion and the third light emitting portion are disposed in the first region of each of the pixel regions, and the transmission portion is disposed in the second region of each of the pixel regions.

In example embodiments, the organic light emitting display device may further include a plurality of first lower electrodes disposed in the first light emitting portions, a plurality of second lower electrodes disposed in the second light emitting portions and a plurality of third lower electrodes disposed in the third light emitting portions.

In example embodiments, the organic light emitting display device may further include a first organic light emitting layer pattern disposed on the plurality of the first lower electrodes, a second organic light emitting layer pattern disposed on the plurality of the second lower electrodes and a third organic light emitting layer pattern disposed on the plurality of the third lower electrodes. The first organic light emitting layer pattern may extend in the second direction, the second organic light emitting layer pattern may extend in the second direction; and the third organic light emitting layer pattern may extend in the second direction.

In example embodiments, the first organic light emitting layer pattern may cover the first light emitting portions, and may exposure the transmission portions. The second organic light emitting layer pattern may cover the second light emitting portions, and may exposure the transmission portions. The third organic light emitting layer pattern may cover the third light emitting portions, and may exposure the transmission portions.

In example embodiments, the organic light emitting display device may further include an upper electrode disposed on the first organic light emitting layer pattern, the second organic light emitting layer pattern and the third organic light emitting layer pattern. The upper electrode may cover the first light emitting portions, the second light emitting portions, the third light emitting portions and the transmission portions.

In example embodiments, the organic light emitting display device may further include an upper electrode disposed on the first organic light emitting layer pattern, the second organic light emitting layer pattern and the third organic light emitting layer pattern. The upper electrode may cover the first light emitting portions, the second light emitting portions and the third light emitting portions, and may exposure the transmission portions.

In example embodiments, the transmission portions may not overlap the first light emitting portion, the second light emitting portion and the third light emitting portion in the second direction.

In example embodiments, a length of the first light emitting portion in the second direction may be substantially greater than a width of the first light emitting portion in the first direction. A length of the second light emitting portion in the second direction may be substantially greater than a width of the second light emitting portion in the first direction. A length of the third light emitting portion in the second direction may be substantially greater than a width of the third light emitting portion in the first direction.

According to example embodiments, a substrate is provided to have a first width in a first direction and a second width in a second direction substantially perpendicular to the first direction. The first width is greater than the second width. A plurality of pixel regions is defined on the substrate. Each of the pixel regions includes a first light emitting portion, a second light emitting portion, a third light emitting portion and a transmission portion arranged along the second direction. A first organic light emitting layer pattern is formed to extend in the first direction. The first organic light emitting layer pattern overlaps the first light emitting portions. A second organic light emitting layer pattern is formed to extend in the first direction. The first organic light emitting layer pattern overlaps the second light emitting portions. A third organic light emitting layer pattern is formed to extend in the first direction. The first organic light emitting layer pattern overlaps the third light emitting portions.

In example embodiments, a plurality of first lower electrodes is formed in the first light emitting portions, a plurality of second lower electrodes is formed in the second light emitting portions, and a plurality of third lower electrodes is formed in the third light emitting portions, before forming the first organic light emitting layer pattern.

In example embodiments, an upper electrode is formed on the first organic light emitting layer pattern, the second organic light emitting layer pattern and the third organic light emitting layer pattern, after forming the third organic light emitting layer pattern.

In example embodiments, forming the first organic light emitting layer pattern may include arranging a mask structure over a deposition apparatus, the mask structure including a plurality of openings; emitting deposition particles from the deposition apparatus by heating the deposition apparatus; and transferring the substrate above the mask structure in the first direction.

In example embodiments, the mask structure may have the second width in the second direction.

In example embodiments, after forming the third organic light emitting layer pattern, an organic layer pattern is formed to cover the transmission portion, and an upper electrode is formed on the first organic light emitting layer pattern, the second organic light emitting layer pattern and the third organic light emitting layer pattern. The upper electrode may expose the transmission portion.

In example embodiments, the organic layer pattern may include lithium quinoline. The upper electrode may include aluminum (Al), platinum (Pt), silver (Ag), magnesium (Mg), gold (Au), chromium (Cr), tungsten (W), molybdenum (Mo), titanium (Ti) or an alloy thereof.

In example embodiments, the upper electrode may not overlap the organic layer pattern, or may overlap an edge portion of the organic layer pattern.

BRIEF DESCRIPTION OF THE DRAWINGS

Features will become apparent to those of ordinary skill in the art by describing in detail exemplary embodiments with reference to the attached drawings, in which:

FIG. 25 illustrates a plan view of an organic light emitting display device in accordance with some example embodiments;

DETAILED DESCRIPTION

Figure 1:
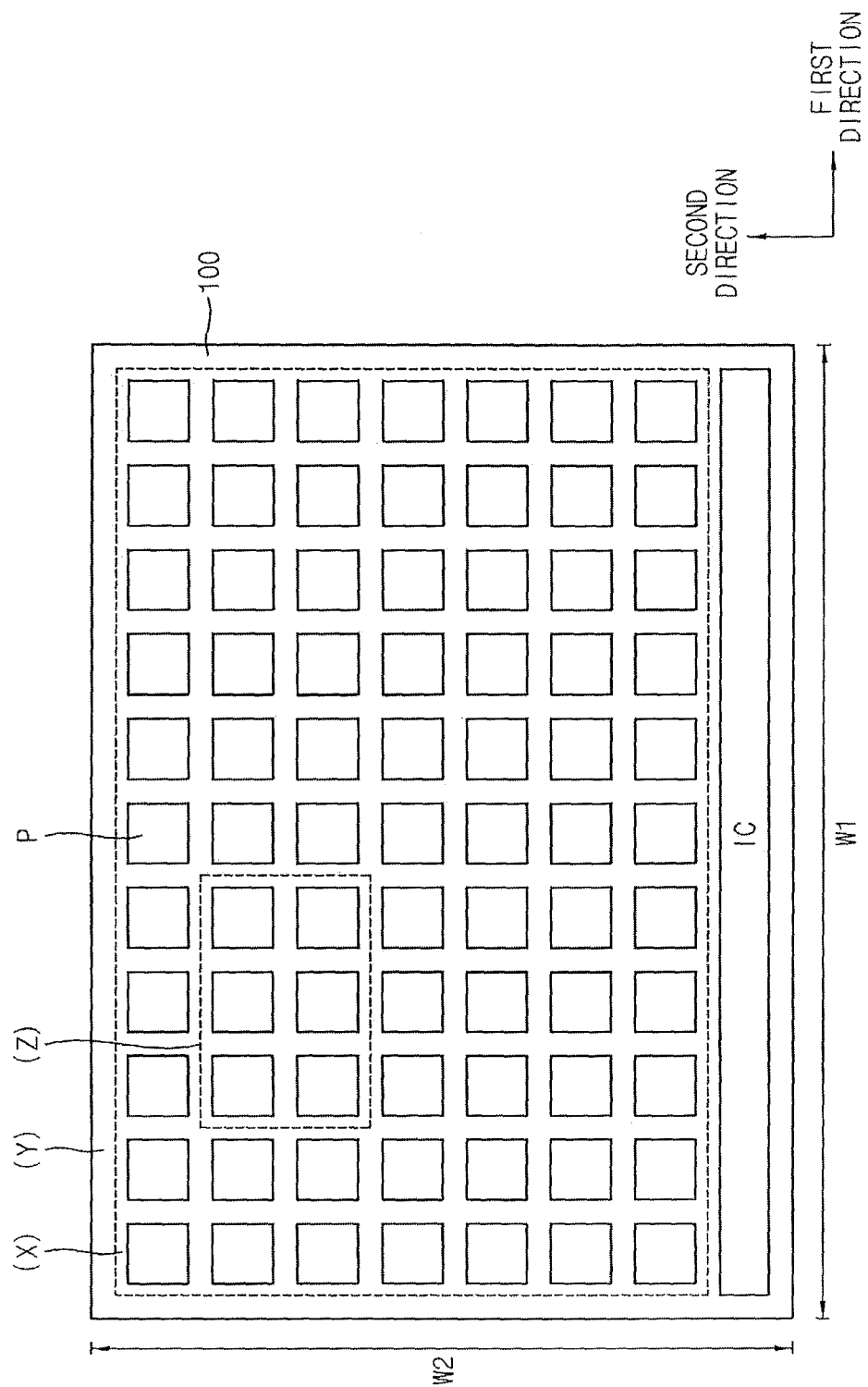
FIG. 1 illustrates a plan view of an organic light emitting display device in accordance with some example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
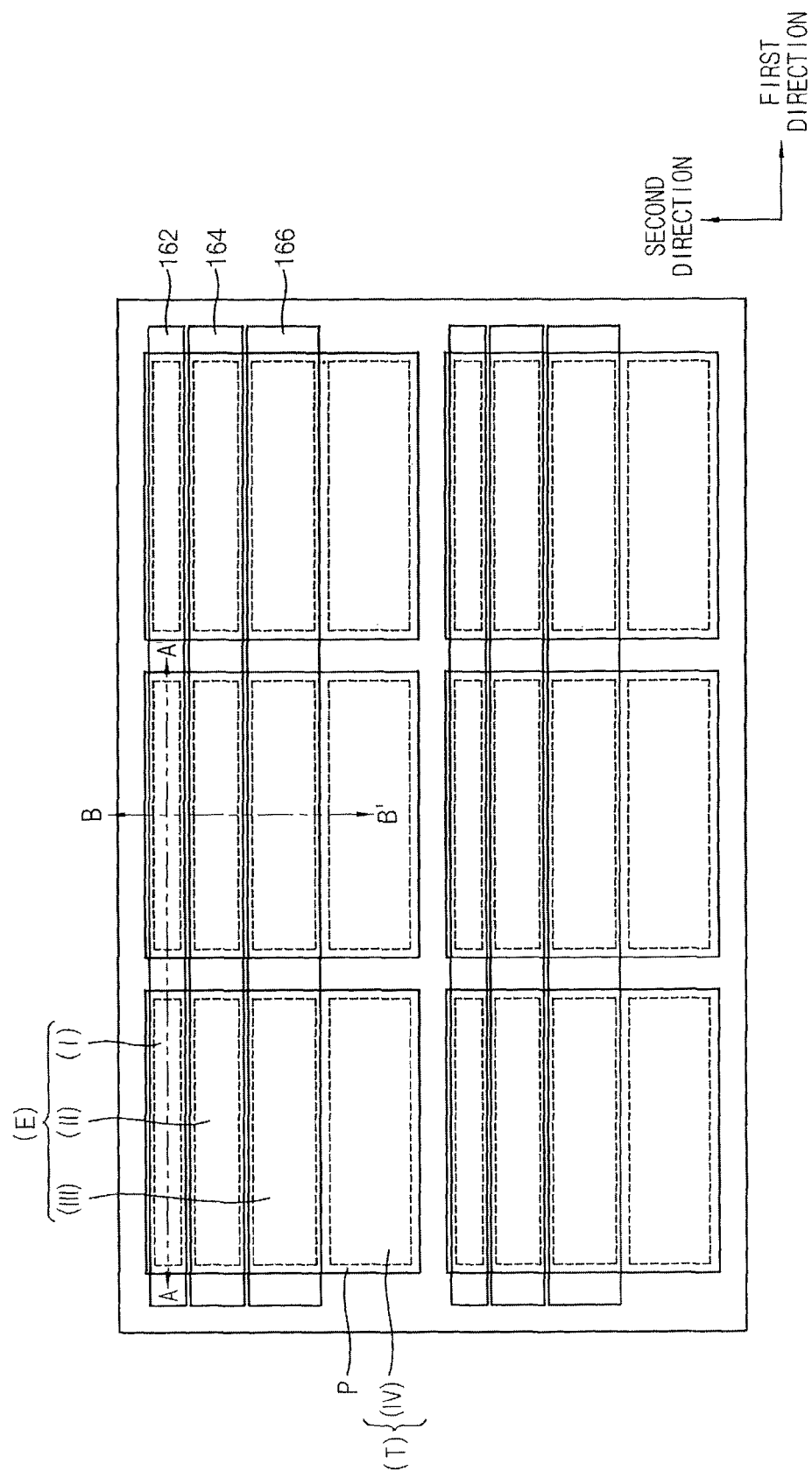
FIG. 2 illustrates an enlarged plan view of FIG. 1.

FIG. 1 illustrates a plan view of an organic light emitting display device in accordance with some example embodiments, and FIG. 2 is an enlarged plan view of region (Z) of FIG. 1.

Referring to FIG. 1, a substrate 100 of the organic light emitting display device may be divided in to a display region (X) and a peripheral region (Y). In example embodiments, the display region (X) may be disposed at a center of the substrate 100, and the peripheral region (Y) may be disposed at edges of the substrate 100. That is, the peripheral region (Y) may surround at least one side of the display region (X). For example, the peripheral region (Y) may surround four sides of the display region (X) as illustrated in FIG. 1, however embodiments are not limited thereto. For example, the peripheral region (Y) may be disposed at a left side, a right side, an upper side and/or a lower side of the display region (X).

The substrate 100 of the organic light emitting display device may have a first width W1 in a first direction, and may have a second width W2 in a second direction. In example embodiment, the first width W1 may be greater than the second width W2. That is, the substrate 100 may have a rectangular shape which may extend in the first direction.

A driving circuit portion (IC) may be disposed in the peripheral region (Y) of the substrate 100. The driving circuit portion (IC) may include a data driver, a scan driver, a level shifter and a buffer circuit which may control and transfer electrical signals into the pixel regions (P). In example embodiments, the driving circuit portion (IC) may be disposed at a lower side or an upper side of the display region (X). Further, the driving circuit portion (IC) may extend in the first direction as illustrated in FIG. 1.

Referring to FIGS. 1 and 2, a plurality of pixel regions (P) may be disposed in the display region (X) of the substrate 100. In example embodiments, the plurality of pixel regions (P) may be arranged on the substrate 100 in the first direction and the second direction. As mentioned above, the substrate 100 may have a rectangular shape which may extend in the first direction, so that the number of pixel regions (P) arranged in the first direction may be greater than the number of pixel regions (P) arranged in the second direction. As illustrated in FIG. 2, each of the pixel regions (P) may include a first region (E) and a second region (T), the first region (E) may include a first light emitting portion (I), a second light emitting portion (II), and a third light emitting portion (III), and the second region (T) may include a transmission portion (IV).

In example embodiments, the first light emitting portion (I), the second light emitting portion (II), and the third light emitting portion (III) may correspond to a red light, a green light, and a blue light. That is, light emitting structures disposed in the first to third light emitting portions (I, II, III) may generate the red light, the green light, and the blue light In example embodiments, each of the first light emitting portion (I), the second light emitting portion (II), and the third light emitting portion (III) may have a polygonal shape extending in the first direction. That is, a length of the first light emitting portion (I) in the first direction may be greater than a width of the first light emitting portion (I) in the second direction, a length of the second light emitting portion (II) in the first direction may be greater than a width of the second light emitting portion (II) in the second direction, and a length of the third light emitting portion (III) in the first direction may be greater than a width of the third light emitting portion (III) in the second direction.

In some example embodiments, the third light emitting portion (III) may have an area greater than those of the first light emitting portion (I) and the second light emitting portion (II). However, embodiments are not limited thereto. For example, the third light emitting portion (III) may have an area substantially identical to those of the first light emitting portion (I) and the second light emitting portion (II).

The first light emitting portion (I), the second light emitting portion (II), and the third light emitting portion (III) may be sequentially arranged in the second direction. That is, the first light emitting portion (I), the second light emitting portion (II), and the third light emitting portion (III) may be spaced apart from each other in the second direction. When viewed from the first direction, the first light emitting portion (I), the second light emitting portion (II), and the third light emitting portion (III) of a same pixel (P) may not overlap each other.

Further, the transmission portion (IV) may be spaced apart from the third light emitting portion (III) in the second direction. In example embodiment, the transmission portion (IV) may occupy a ratio in the range of about 20% to about 90% with respect to an area of the pixel region (P).

Referring now to FIG. 2, the first light emitting portions (I), the second light emitting portions (II), the third light emitting portions (III) and the transmission portions (IV) of adjacent pixel regions (P) may be arranged in the first direction. That is, the first light emitting portions (I) of adjacent pixel regions (P) may be arranged in the first direction. The second light emitting portions (II) of adjacent pixel regions (P) may be arranged in the first direction. The third light emitting portions (III) of adjacent pixel regions (P) may be arranged in the first direction. Further, the transmission portions (IV) of adjacent pixel regions (P) may be arranged in the first direction. Accordingly, when viewed from the first direction, the transmission portion (IV) of a pixel region (P) may not overlap the first light emitting portion (I), the second light emitting portion (II), and the third light emitting portion (III) of a same pixel region (P) or of adjacent pixel regions (P). Further, an organic light emitting structure and a pixel circuit for electrically controlling the organic light emitting structure may be disposed in each of the first light emitting portion (I), the second light emitting portion (II), and the third light emitting portion (III).

Figure 3:
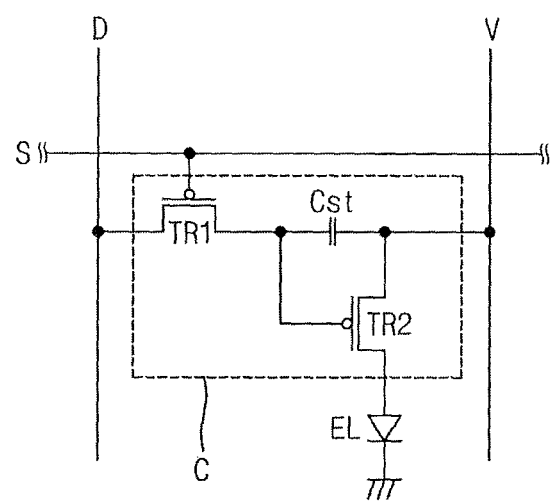
FIG. 3 illustrates a schematic view of a pixel circuit of an organic light emitting display device in accordance with some example embodiments.
Figure 4:
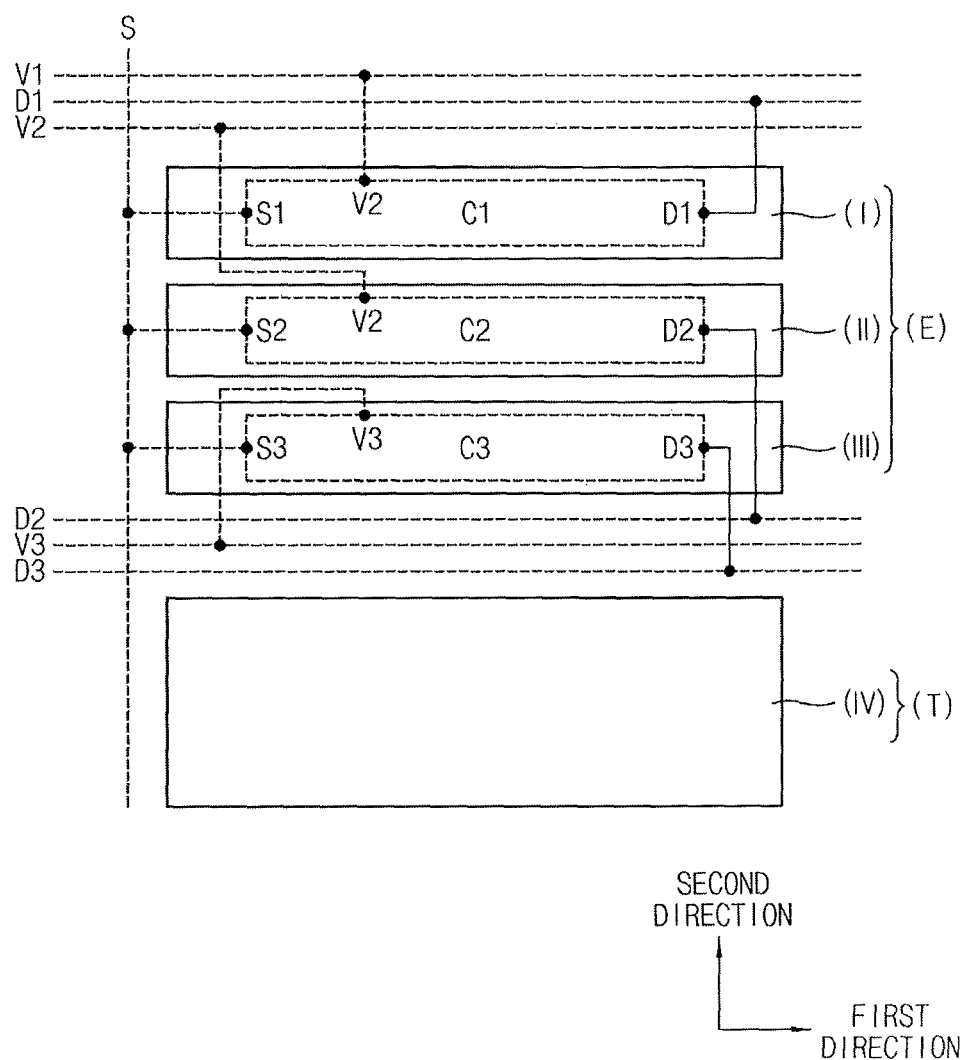
FIG. 4 illustrates a plan view of an organic light emitting display device in accordance with some example embodiments.

FIG. 3 illustrates a schematic view of a pixel circuit of an organic light emitting display device in accordance with some example embodiments, and FIG. 4 is a plan view of an organic light emitting display device in accordance with some example embodiments.

Referring to FIG. 3, a scan line (S), a data line (D), and a Vdd line (V) may be electrically connected to the pixel circuit (C). In example embodiments, other lines may be electrically connected to the pixel circuit (C) depending on a structure of the pixel circuit (C).

In example embodiments, the pixel circuit (C) may include a first transistor (TR1), a second transistor (TR2), and a storage capacitor (Cst). In this case, the first transistor (TR1) may be electrically connected to the scan line (S) and the data line (D), the second transistor (TR2) may be electrically connected to the first transistor (TR1) and the Vdd line (V), and the storage capacitor (Cst) may be electrically connected to the first transistor (TR1) and the Vdd line (V). That is, a first electrode of the second transistor (TR2) may be electrically connected to the Vdd line (V) and the storage capacitor (Cst), and a second electrode of the second transistor (TR2) may be electrically connected to organic light emitting diode (EL). The first transistor (TR1) may be a switching transistor, and the second transistor (TR2) may be a driving transistor.

The pixel circuit (C) in FIG. 3 is an exemplary embodiment, and embodiments are not limited thereto. For example, the pixel circuit (C) may include seven transistors and two capacitors.

Referring to FIG. 4, a single scan line (S) may be electrically connected to a first pixel circuit (C1), a second pixel circuit (C2), and a third pixel circuit (C3). That is, pixel circuits (C1, C2, C3) arranged in a same column may be electrically connected to the single scan line (S), i.e., to a same scan line (S). The first pixel circuit (C1), the second pixel circuit (C2), and the third pixel circuit (C3) may be disposed in the first light emitting portion (I), the second light emitting portion (II), and the third light emitting portion (III), respectively. The first pixel circuit (C1), the second pixel circuit (C2), and the third pixel circuit (C3) may not be disposed in the transmission portion (IV), so that the first pixel circuit (C1), the second pixel circuit (C2), and the third pixel circuit (C3) may not degrade transmittance of the transmission portion (IV).

The first pixel circuit (C1), the second pixel circuit (C2), and the third pixel circuit (C3) may be disposed adjacent to the transmission portion (IV), so that a first data line (D1), a second data line (D2), and a third data line (D3) electrically connected to the first pixel circuit (C1), the second pixel circuit (C2), and the third pixel circuit (C3), respectively, may be disposed adjacent to the transmission portion (IV). Referring to FIG. 4, the first data line (D1) may be disposed above the first light emitting portion (I), and the second data line (D2) and the third data line (D3) may be disposed between the third light emitting portion (III) and the transmission portion (IV). Therefore, the first data line (D1), the second data line (D2), and the third data line (D3) may not overlap the transmission portion (IV).

Further, a first Vdd line (V1), a second Vdd line (V2), and a third Vdd line (V3) electrically connected to the first pixel circuit (C1), the second pixel circuit (C2), and the third pixel circuit (C3), respectively, may be disposed adjacent to the transmission portion (IV). However, the first Vdd line (V1), the second Vdd line (V2), and the third Vdd line (V3) may not overlap the transmission portion (IV). The first Vdd line (V1), the second Vdd line (V2), and the third Vdd line (V3) may not degrade transmittance of the transmission portion (IV).

Figure 5:
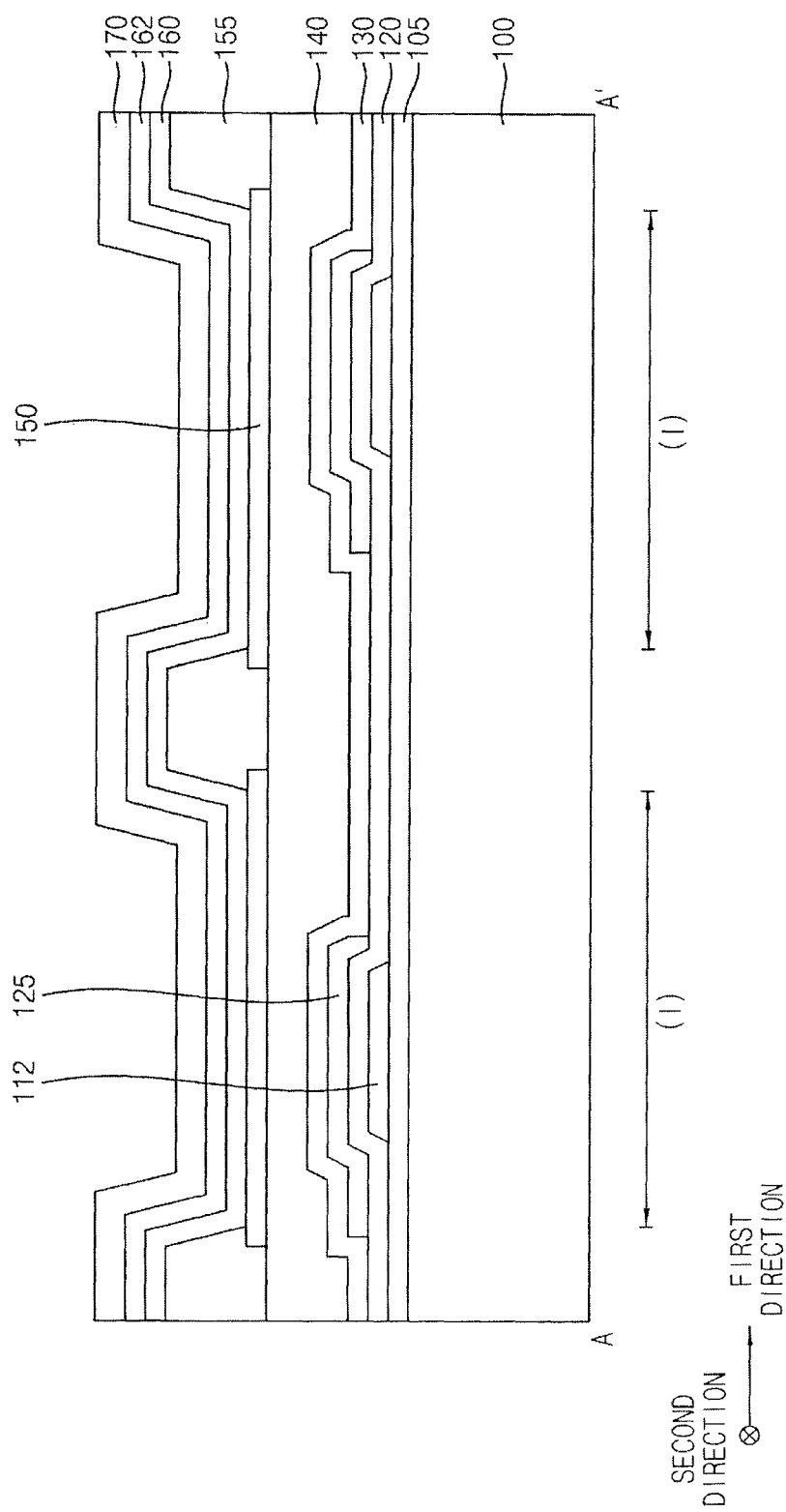
FIG. 5 illustrates a cross sectional view cut along a line A-A' of FIG. 2 in accordance with some example embodiments.
Figure 6:
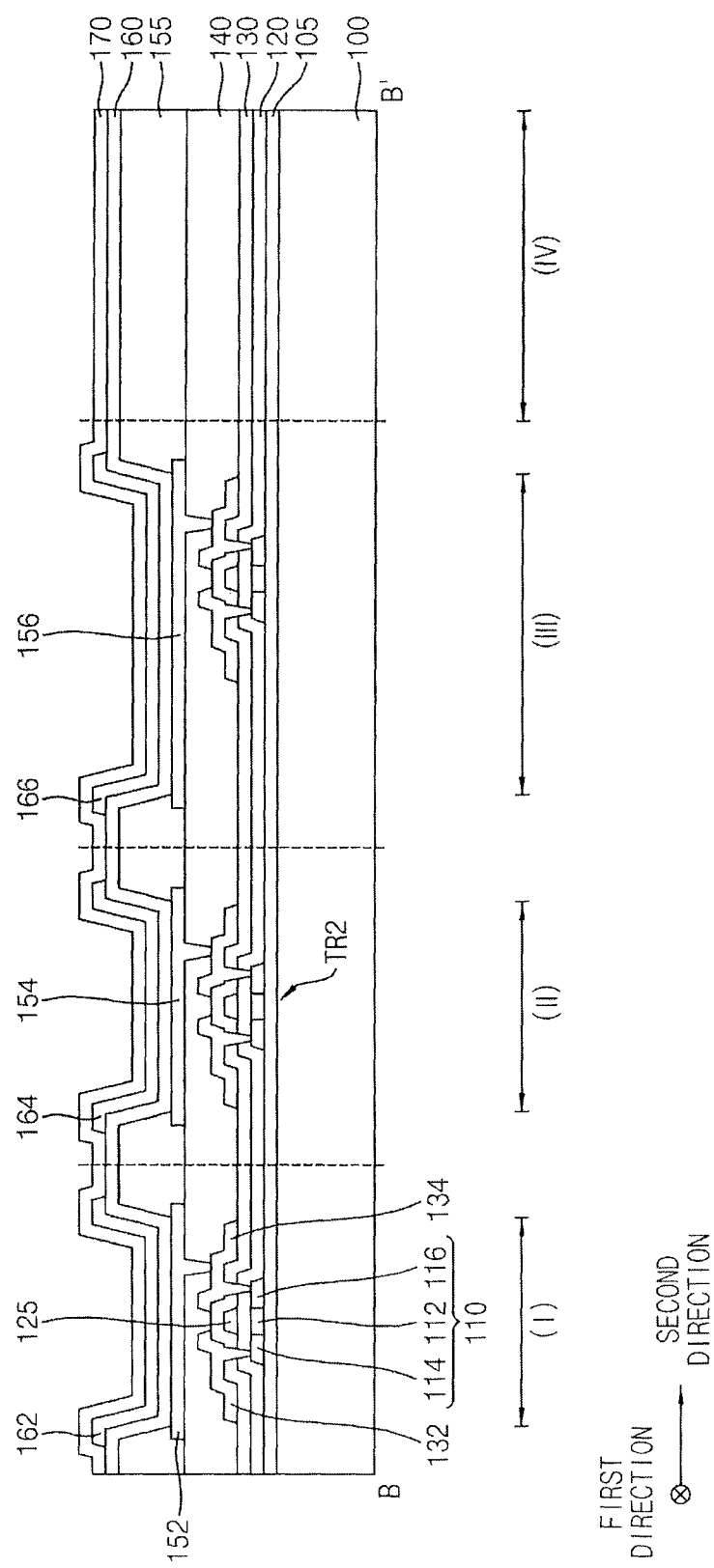
FIG. 6 illustrates a cross sectional view cut along a line B-B' of FIG. 2 in accordance with some example embodiments.

FIG. 5 illustrates a cross sectional view cut along line A-A' of FIG. 2 in accordance with some example embodiments, and FIG. 6 is a cross sectional view cut along line B-B' of FIG. 2 in accordance with some example embodiments.

Referring to FIGS. 5 and 6, the pixel circuits and the light emitting structures may be disposed on the light emitting portions (I, II, III) of the substrate 100. The organic light emitting display device may include the substrate 100, a switching structure of the pixel circuit, lower electrodes 152, 154 and 156, the light emitting structures, and upper electrodes 170.

The substrate 100 may include a transparent insulation substrate. For example, the substrate 100 may include a glass substrate, a quartz substrate, a transparent resin substrate, or the like. Alternatively, the substrate 100 may include a flexible substrate.

A buffer layer 105 may be disposed on the substrate 100. The buffer layer 105 may provide a flat top surface, and may prevent impurities from diffusing into the substrate 100. The buffer layer 105 may include an inorganic material, an organic material, or a stacked structure thereof. For example, the inorganic material may include silicon oxide, silicon nitride, silicon oxy nitride, aluminum oxide, aluminum nitride, titanium oxide or titanium nitride, the organic material may include polyimide, polyester or acryl. In other example embodiments, the buffer layer 105 may be omitted.

Transistors and capacitors constituting the pixel circuit may be disposed on the buffer layer 105. The pixel circuit may be disposed in the first light emitting portion (I), the second light emitting portion (II), and the third light emitting portion (III).

For convenience of description, the second transistor (TR2) is illustrated in FIGS. 5 and 6, however the first transistor (not shown) and the capacitor (not shown) may be further disposed on the buffer layer 105.

The active pattern 110 may include oxide semiconductor, polysilicon, doped polysilicon, amorphous silicon, doped amorphous silicon, and the like. In example embodiments, the oxide semiconductor may include a binary compound ($AB_x$), a ternary compound ($AB_xC_y$), a quaternary compound ($AB_xC_yO_z$), etc. which may contain indium (In), zinc (Zn), gallium (Ga), tin (Sn), titanium (Ti), aluminum (Al), hafnium (Hf), zirconium (Zr), magnesium (Mg), etc. These may be used alone or in a mixture thereof. For example, the oxide semiconductor may include a G-I-Z-O layer [$(In_2O_3)_a(Ga_2O_3)_b(ZnO)_c$ layer], wherein a, b, and c are each a real number satisfying a≥0, b≥0, c>0. When the active pattern 110 is formed of the oxide semiconductor, transmittance of external light of the light emitting portions (I, II, III) may be increased.

Further, the active portion 110 may include a channel region 112, a source region 114, and a drain region 116. The source region 114 and the drain region 116 may be doped with impurities, and the channel region 112 may be disposed between the source region 114 and the drain region 116.

A gate insulation layer 120 may be disposed to cover the active pattern 110, and a gate electrode 125 may be disposed on the gate insulation layer 120. In example embodiments, the gate electrode 125 may overlap the channel region 112 of the active pattern 110.

A first insulating interlayer 130 may be disposed to cover the gate electrode 125, and a source electrode 132 and a drain electrode 134 may be electrically connected to the source region 114 and the drain region 116 through the first insulating interlayer 130 and the gate insulation layer 120.

The second transistor TR2 illustrated in FIG. 5 may have a top gate structure in which the gate electrode 125 is disposed above the active pattern 110, however embodiments are not limited thereto. For example, the transistors may have a bottom gate structure in which the active patterns are disposed above the gate electrodes.

Further, a second insulating interlayer 140 may be disposed to cover the pixel circuit including the second transistor (Tr2). In example embodiments, the second insulating interlayer 140 may have an upper surface which is substantially flat.

The lower electrodes 152, 154, and 156 may be disposed on the second insulating interlayer 140. The lower electrodes 152, 154, and 156 may be disposed in the light emitting portions (I, II, III), respectively. In example embodiments, the first lower electrode 152 may be disposed in the first light emitting portion (I), the second lower electrode 154 may be disposed in the second light emitting portion (II), and the third lower electrode 156 may be disposed in the third light emitting portion (III). That is, the lower electrode 152, 154, and 156 may not be disposed in the transmission portion (IV). The lower electrodes 152, 154, and 156 may include a transparent conductive material such as indium zinc oxide (IZO) or indium tin oxide (ITO).

A pixel defining layer 155 may be disposed on the second insulating interlayer 140 to partially cover the lower electrodes 152, 154 and 156. In example embodiments, the pixel defining layer 155 may include an organic insulation material or an inorganic insulation material such as silicon oxide or silicon nitride.

A hole transfer layer 160 may be disposed on the lower electrode 152, 154, and 156 and the pixel defining layer 155. In example embodiment, hole transfer layer 160 may be formed without using a mask or performing an etching process using an etching solution.

Organic light emitting layer patterns 162, 164, and 166 may be disposed on top surfaces of the lower electrodes 152, 154, and 156 and sidewalls of the pixel defining layer 155. In example embodiments, the organic light emitting layer patterns 162, 164, and 166 may have a thickness in a range of about 200 Å to about 500 Å. e.g., about 250 Å to about 350 Å.

Referring to FIGS. 2, 5 and 6, the first organic light emitting layer pattern 162 may extend in the first direction, so that the first organic light emitting layer pattern 162 may overlap the plurality of first light emitting portions (I). The second organic light emitting layer pattern 164 may extend in the first direction, so that the second organic light emitting layer pattern 164 may overlap the plurality of second light emitting portions (II). The third organic light emitting layer pattern 166 may extend in the first direction, so that the third organic light emitting layer pattern 166 may overlap the plurality of third light emitting portions (III). Further, the first organic light emitting layer 162, the second organic light emitting layer pattern 164, and the third organic light emitting layer pattern 166 may be spaced apart from each other in the second direction.

As mentioned above, when viewed from the first direction, the first light emitting portion (I), the second light emitting portion (II), and the third light emitting portion (III) may not overlap the transmission portion (IV), so that the first organic light emitting layer 162, the second organic light emitting layer pattern 164, and the third organic light emitting layer pattern 166 may not overlap the transmission portion (IV). That is, external light passing through the transmission portion (IV) may not pass through the organic light emitting layer patterns 162, 164, and 166, so that transmittance of external light in the transmission portion (IV) may be increased, and a color shift problem due to the organic light emitting layer patterns 162, 164, and 166 may be prevented.

In example embodiments, the first organic light emitting layer pattern 162 may include a material for emitting red light, the second organic light emitting layer pattern 164 may include a material for emitting green light, and the third organic light emitting layer pattern 166 may include a material for emitting blue light.

In other example embodiments, a hole injection layer (HIL) may be further disposed below the hole transfer layer 160, and an electron transfer layer (ETL) and/or an electrode injection layer (EIL) may be further disposed on the organic light emitting layer patterns 162, 164, and 166.

The upper electrode 170 may be disposed on the organic light emitting layer patterns 162, 164, and 166 and hole transfer layer 160. For example, the upper electrode 170 may include aluminum (Al), platinum (Pt), silver (Ag), magnesium (Mg), gold (Au), chromium (Cr), tungsten (W), molybdenum (Mo), titanium (Ti) or an alloy thereof. However, the upper electrode 170 may have a relatively thin thickness, so that the upper electrode 170 may have a relatively high transmittance.

Figure 7:
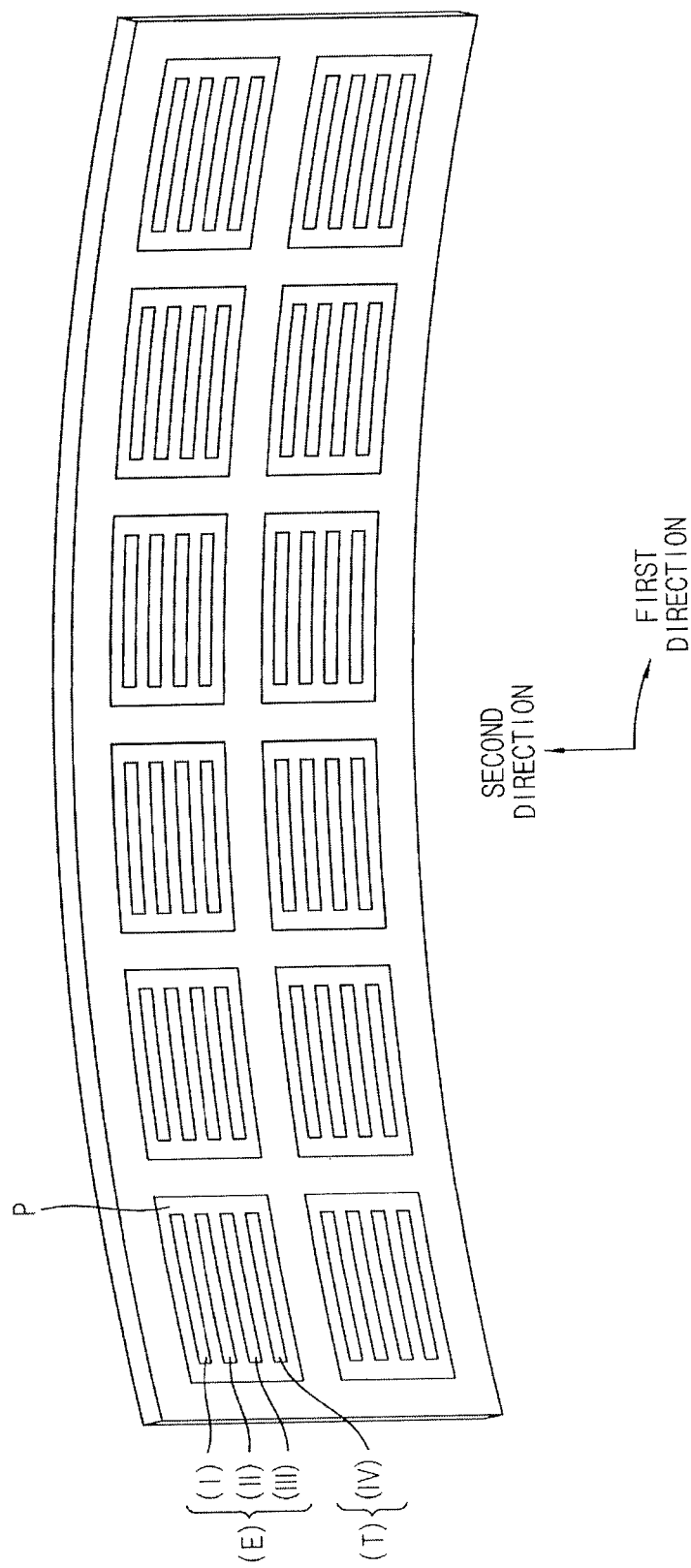
FIG. 7 illustrates a perspective view of an organic light emitting display device in accordance with some example embodiments.

FIG. 7 illustrates a perspective view of an organic light emitting display device in accordance with some example embodiments. The organic light emitting display device may be substantially similar to those described with reference to FIGS. 1 to 6. The organic light emitting display device may have a predetermined flexibility and may be curved in a predetermined direction.

Referring to FIG. 7, the organic light emitting display device may be curved along the first direction about an axis extending in the second direction. Therefore, when a user views the organic light emitting display device, a length of the organic light emitting display device in the first direction may decrease.

As mentioned above, each of the first light emitting portion (I), the second light emitting portion (II), and the third light emitting portion (III) may have a rectangular shape extending in the first direction. When the organic light emitting display device is curved along the first direction about an axis extending in the second direction, each of the first light emitting portion (I), the second light emitting portion (II), and the third light emitting portion (III) may have a rectangular shape with reduced length. Therefore, visibility of each of the first light emitting portion (I), the second light emitting portion (II), and the third light emitting portion (III) may not be degraded due to the curved shape.

FIGS. 8 to 23 illustrate plan views, cross sectional views, and perspective views of stages in a method of manufacturing an organic light emitting display device in accordance with some example embodiments.

Figure 8:
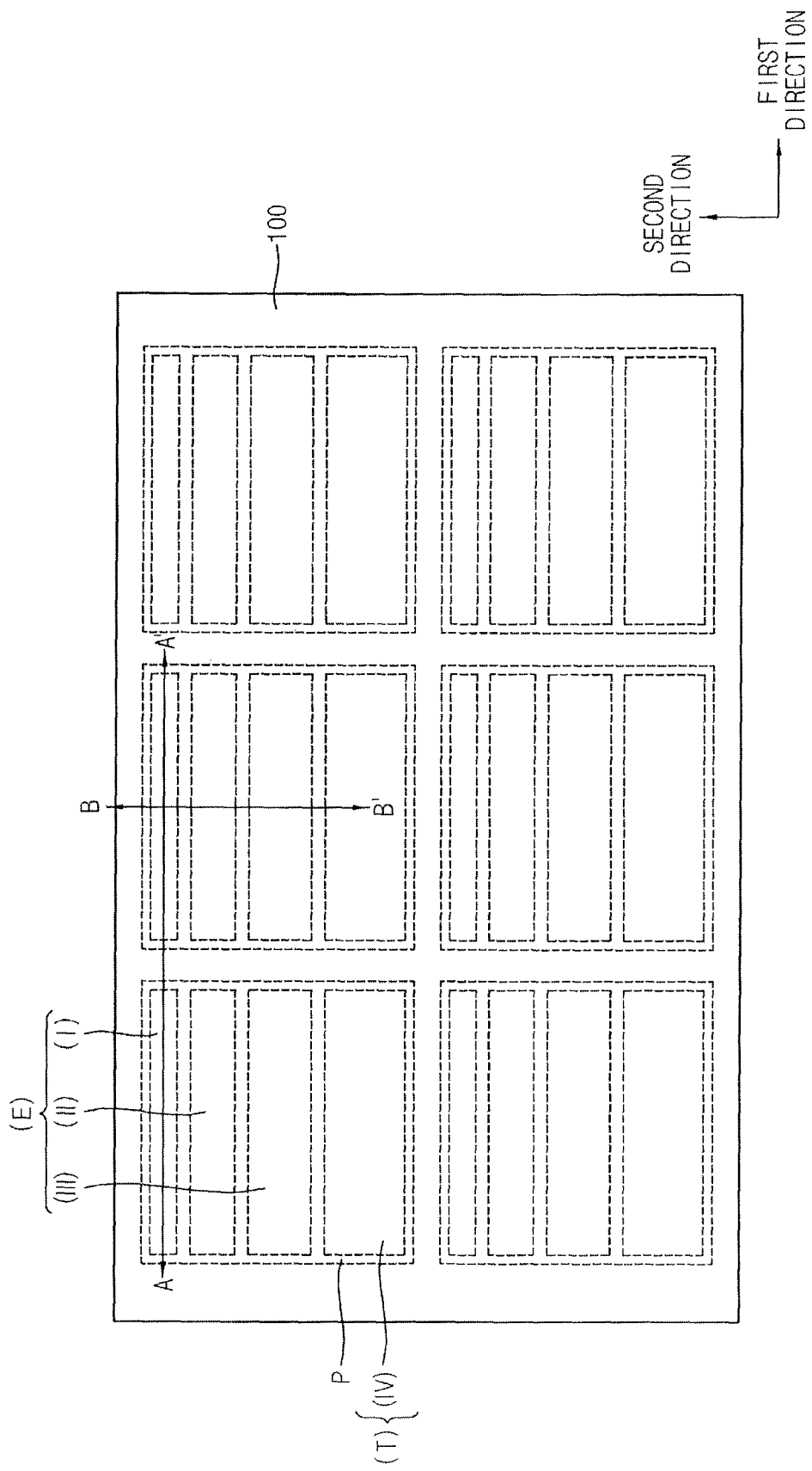
FIGS. 8 to 23 are plan views, cross sectional views and perspective views of stages in a method of manufacturing an organic light emitting display device in accordance with some example embodiments.

Referring to FIG. 8, the substrate 100 including the plurality of pixel regions (P) may be provided. The plurality of pixel regions (P) may be arranged in the first direction and the second direction. Each of the pixel region (P) may include the first light emitting portion (I), the second light emitting portion (II), the third light emitting portion (III), and the transmission portion (IV).

In example embodiments, each of the first light emitting portion (I), the second light emitting portion (II), and the third light emitting portion (III) may have a rectangular shape extending in the first direction. That is, a length of the first light emitting portion (I) in the first direction may be greater than a width of the first light emitting portion (I) in the second direction, a length of the second light emitting portion (II) in the first direction may be greater than a width of the second light emitting portion (II) in the second direction, and a length of the third light emitting portion (III) in the first direction may be greater than a width of the third light emitting portion (III) in the second direction.

The first light emitting portion (I), the second light emitting portion (II), and the third light emitting portion (III) may be spaced apart from each other in the second direction. The first light emitting portion (I), the second light emitting portion (II), and the third light emitting portion (III) may be sequentially arranged in the second direction.

Further, the transmission portion (IV) may be spaced apart from the third light emitting portion (III) in the second direction. In example embodiment, the transmission portion (IV) may occupy a ratio in the range of about 20% to about 90% with respect to an area of the pixel region (P).

Referring now to FIG. 8, the first light emitting portions (I), the second light emitting portions (II), the third light emitting portions (III), and the transmission portions (IV) of adjacent pixel regions (P) may be arranged in the first direction. That is, the first light emitting portions (I) of adjacent pixel regions (P) may be arranged in the first direction. The second light emitting portions (II) of adjacent pixel regions (P) may be arranged in the first direction. The third light emitting portions (III) of adjacent pixel regions (P) may be arranged in the first direction. Further, the transmission portions (IV) of adjacent pixel regions (P) may be arranged in the first direction. Accordingly, when viewed from the first direction, the transmission portion (IV) may not overlap the first light emitting portion (I), the second light emitting portion (II), and the third light emitting portion (III).

Figure 9:
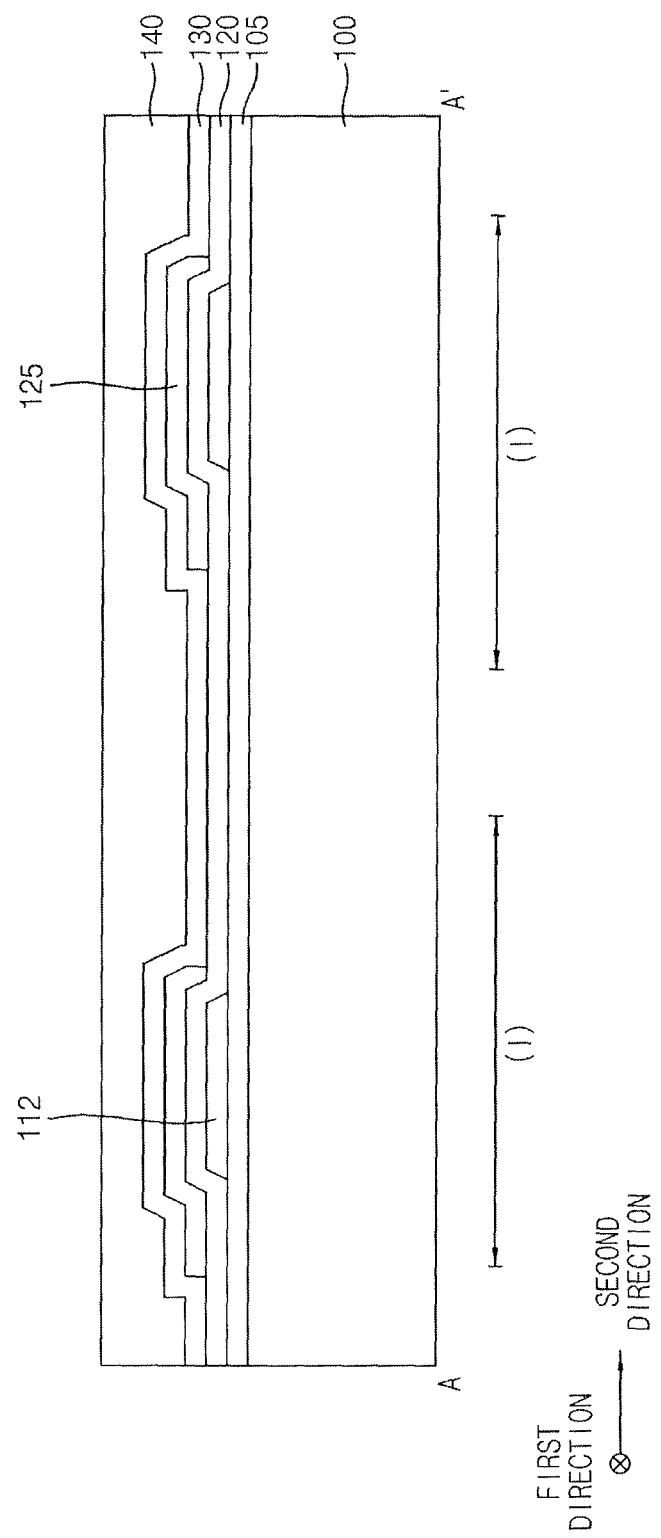
Figure 10:
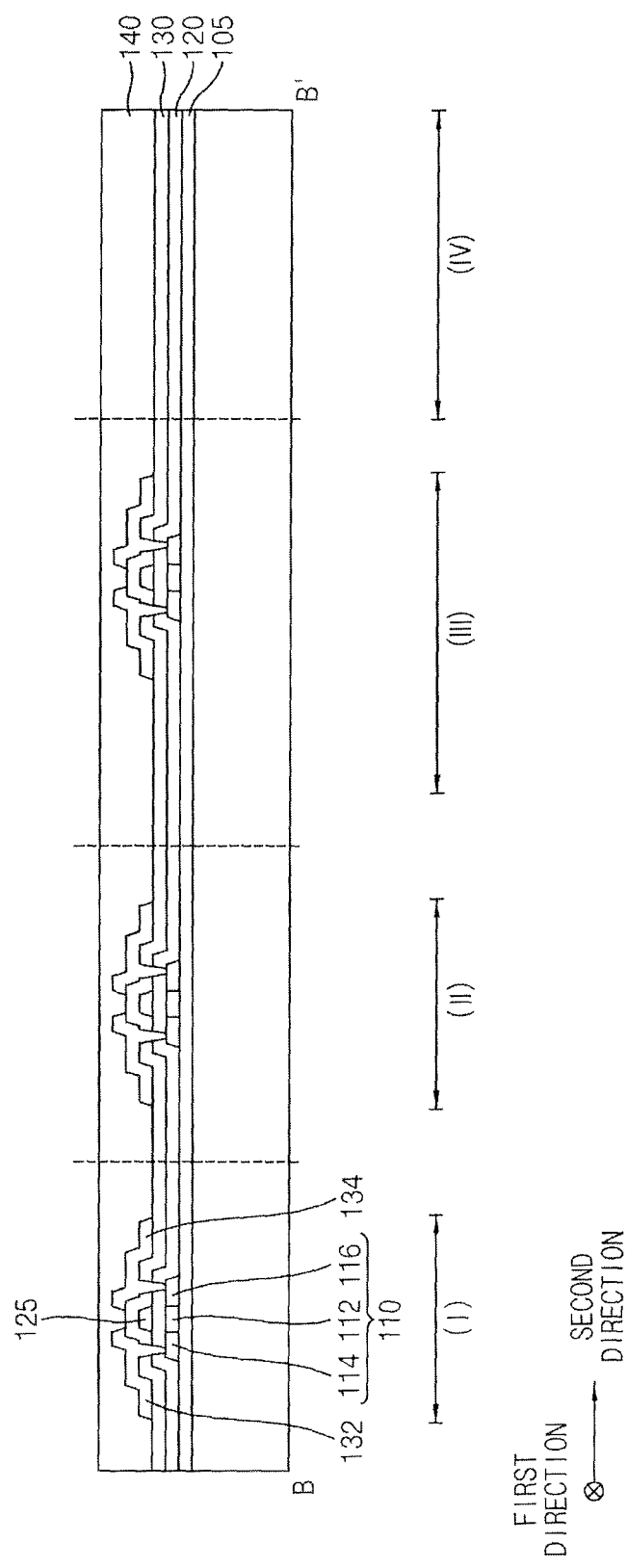

Referring to FIGS. 9 and 10, a pixel circuit including the second transistor (TR2) may be formed on the substrate 100. For convenience of description, the second transistor (TR2) is illustrated in FIGS. 9 and 10, however the first transistor (not shown) and the capacitor (not shown) may be disposed on the substrate 100.

Firstly, the buffer layer 105 may be formed on the substrate 100. In example embodiments, the buffer layer 105 may be formed by a deposition process or a coating process using an inorganic material, an organic material, or a stacked structure thereof. For example, the inorganic material may include silicon oxide, silicon nitride, silicon oxy nitride, aluminum oxide, aluminum nitride, titanium oxide or titanium nitride, the organic material may include polyimide, polyester or acryl. In other example embodiments, the buffer layer 105 may be omitted.

A semiconductor layer may be formed on the buffer layer 105 using oxide semiconductor, polysilicon, doped polysilicon, amorphous silicon, doped amorphous silicon, and the like, and then the semiconductor layer may be partially etched to form active patterns 110. In example embodiment, the semiconductor layer may be formed using oxide semiconductor by a sputtering process using a plurality of targets.

Then, a gate insulation layer 120 may be formed to cover the active patterns 110, and a gate electrode 125 may be formed on the gate insulation layer 120 to overlap the active pattern 110. Further, impurities may be implanted into portions of the active pattern 110 by using the gate electrode 125 as an ion implantation mask, thereby forming a source region 114 and a drain region 116.

A first insulating interlayer 130 may be formed to cover the gate electrode 125. A source electrode 132 and a drain electrode 134 may be formed through the first insulating interlayer 130 and the gate insulation layer 120, so that the source electrode 132 and the drain electrode 134 may be electrically connected to the source region 114 and the drain region 116, respectively.

Then, a second insulating interlayer 140 may be formed on the first insulating interlayer 130 to cover the source electrode 132 and the drain electrode 134. The second insulating interlayer 140 may have a top surface which may be substantially flat.

Figure 11:
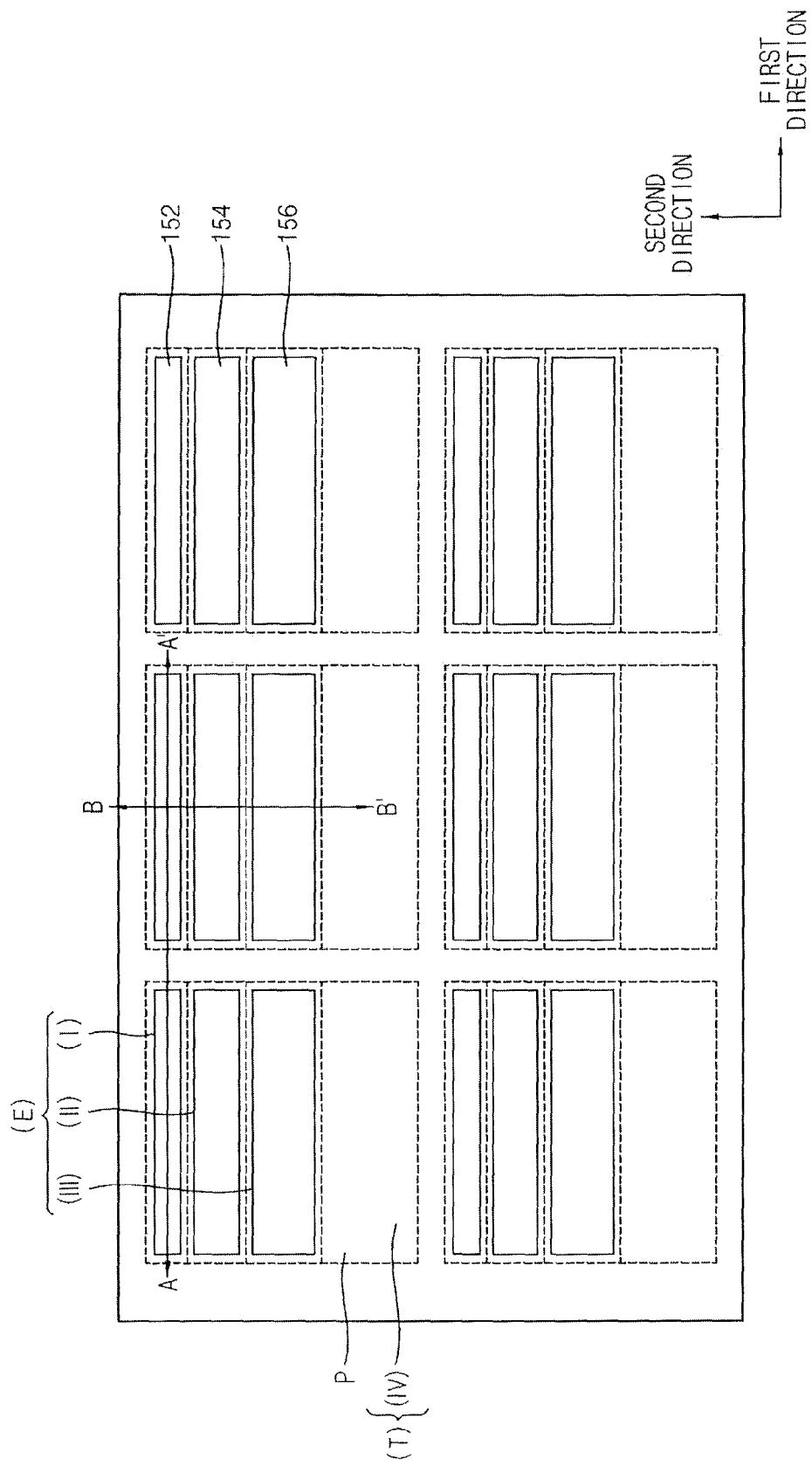
Figure 12:
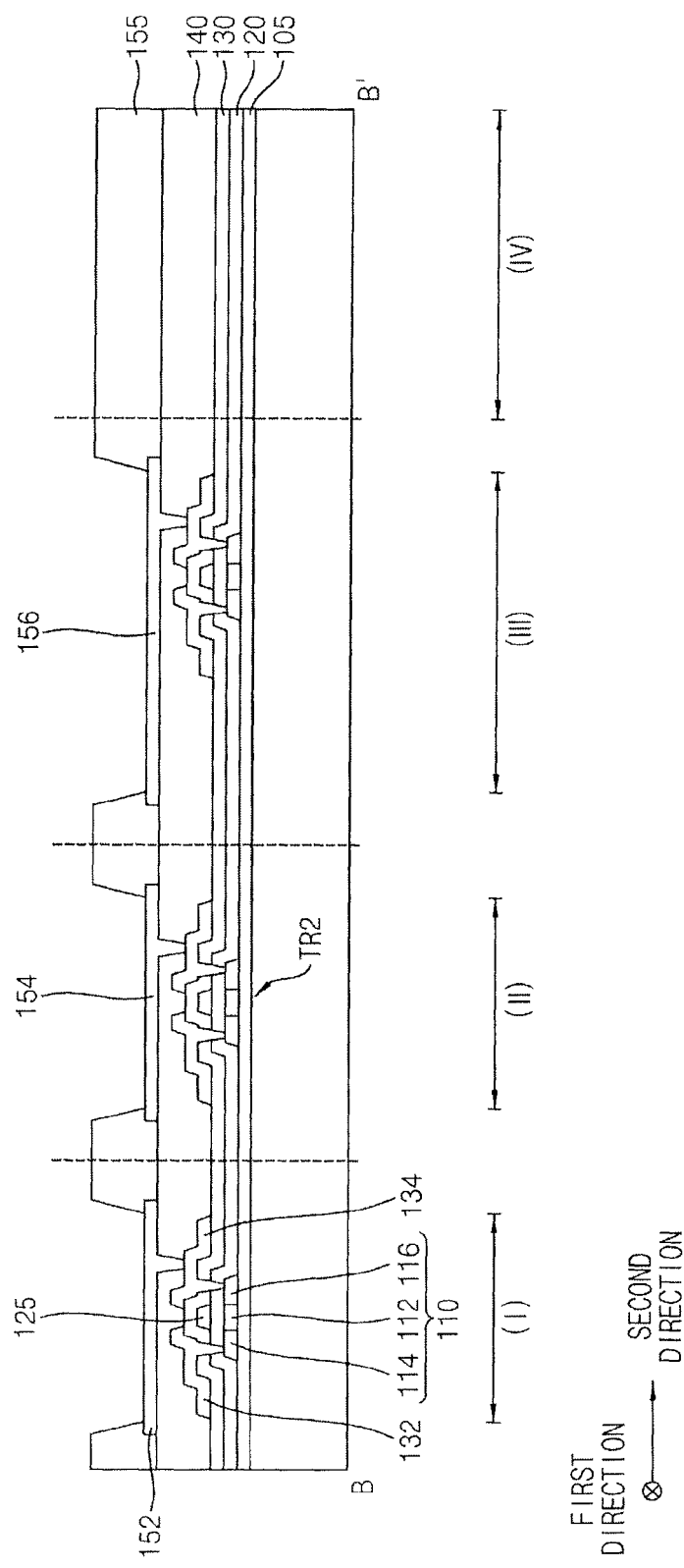
Figure 13:
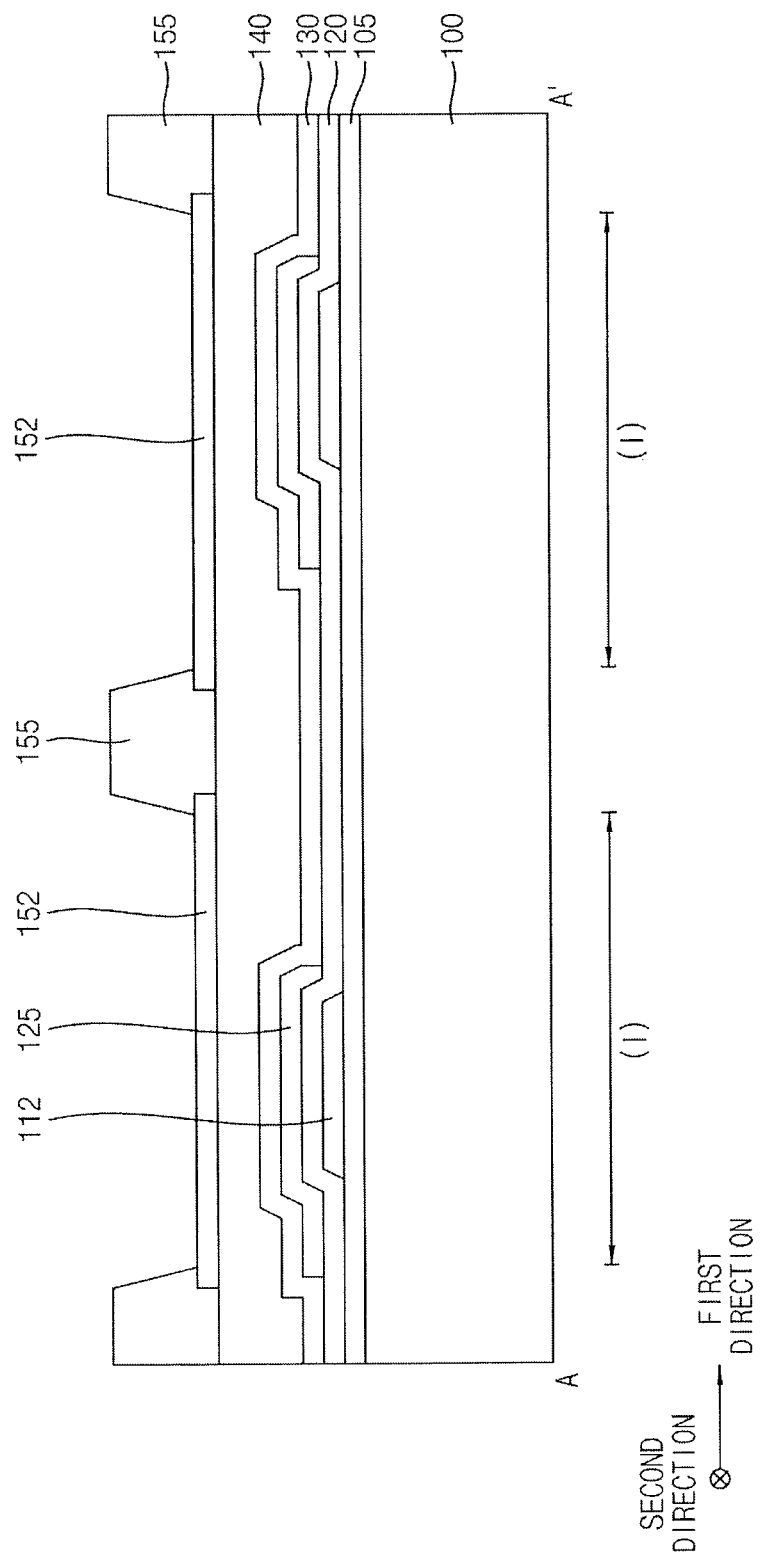

Referring to FIGS. 11 to 13, lower electrodes 152, 154, and 156 and a pixel defining layer 155 may be formed on the second insulating interlayer 140. The second insulating interlayer 140 may be partially removed to form a contact hole exposing the drain electrode 134, a lower electrode layer may be formed on the second insulating interlayer 140 to fill the contact hole, and then the lower electrode layer may be partially removed to form the lower electrodes 152, 154 and 156.

The lower electrodes 152, 154, and 156 may be disposed in the light emitting portions (I, II, III), respectively. That is, the lower electrode 152, 154, and 156 may not be disposed in the transmission portion (IV). In example embodiments, the lower electrode layer may be formed using a transparent conductive material such as indium zinc oxide (IZO) or indium tin oxide (ITO).

Then, the pixel defining layer 155 may be formed to partially cover the lower electrodes 152, 154, and 156. In example embodiments, the pixel defining layer 155 may partially expose the first lower electrode 152 in the first light emitting portion (I), may partially expose the second lower electrode 154 in the second light emitting portion (II), and may partially expose the third lower electrode 156 in the third light emitting portion (III). In example embodiments, the pixel defining layer 155 may be formed in the transmission portion (IV) as illustrated in FIG. 12. Alternatively, the pixel defining layer 155 is not formed in the transmission portion (IV).

Figure 14:
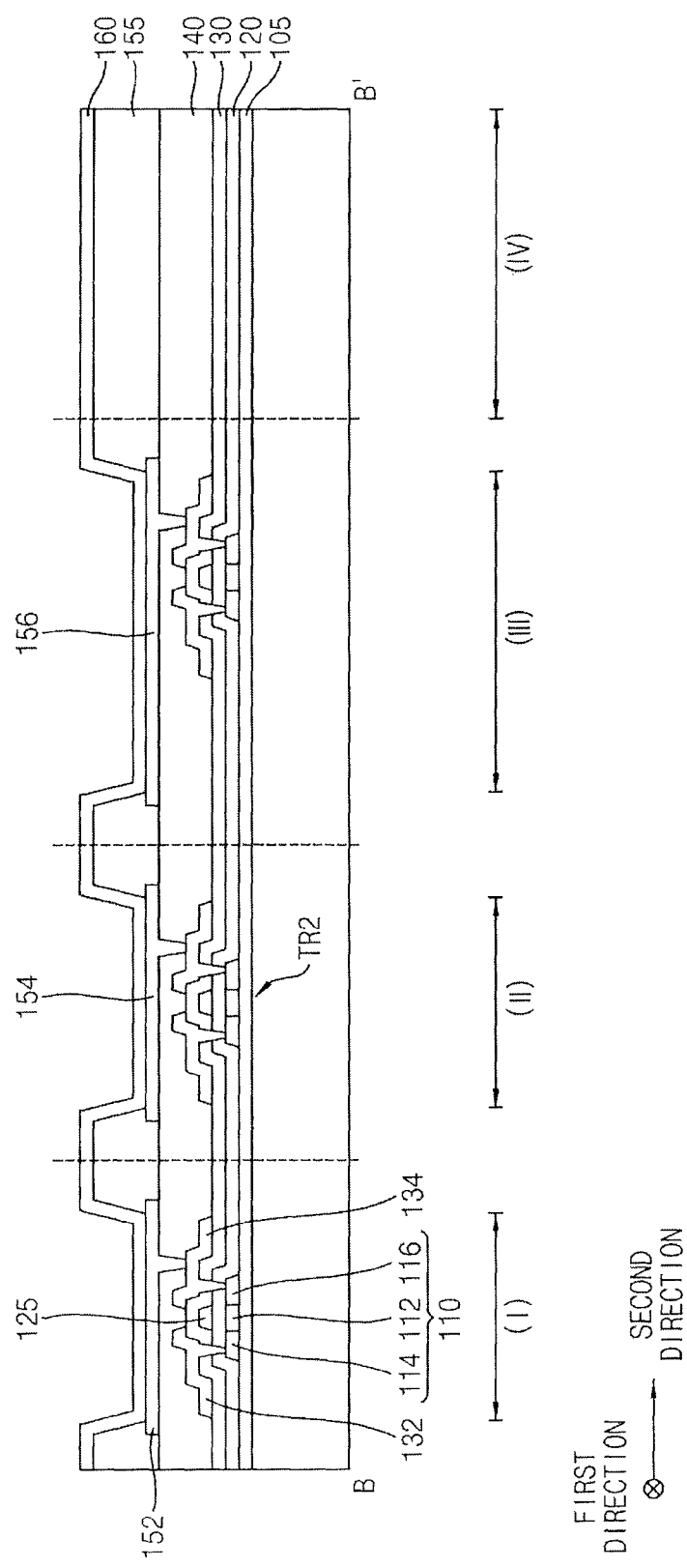

Referring to FIG. 14, a hole transfer layer 160 may be formed on the lower electrodes 152, 154, and 156 and the pixel defining layer 155. In example embodiments, the hole transfer layer 160 may be formed in the first light emitting portion (I), the second light emitting portion (II), the third light emitting portion (III), and the transmission portion (IV). That is, the hole transfer layer 160 may be formed without using an additional mask or without performing an additional patterning process.

Figure 15:
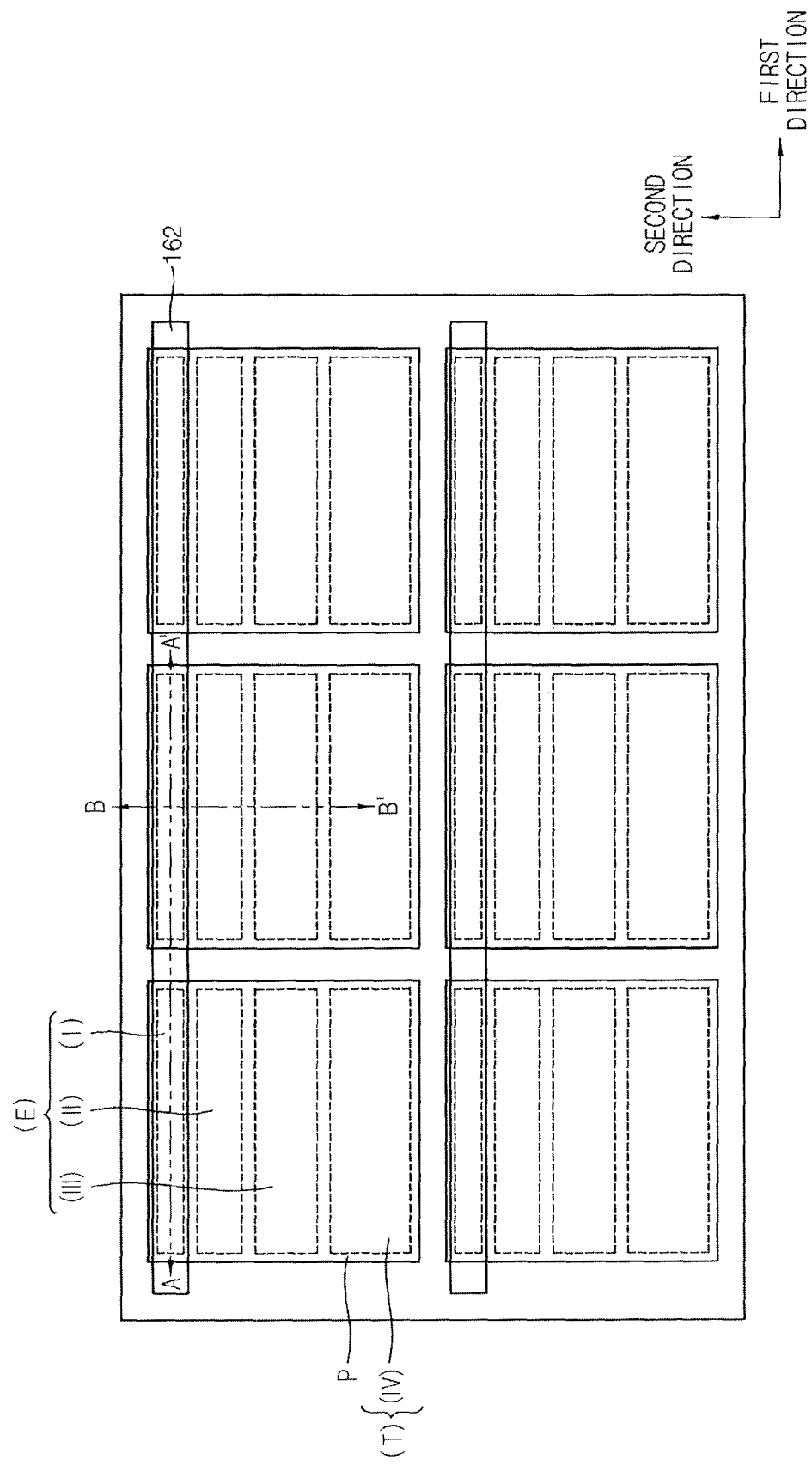
Figure 16:
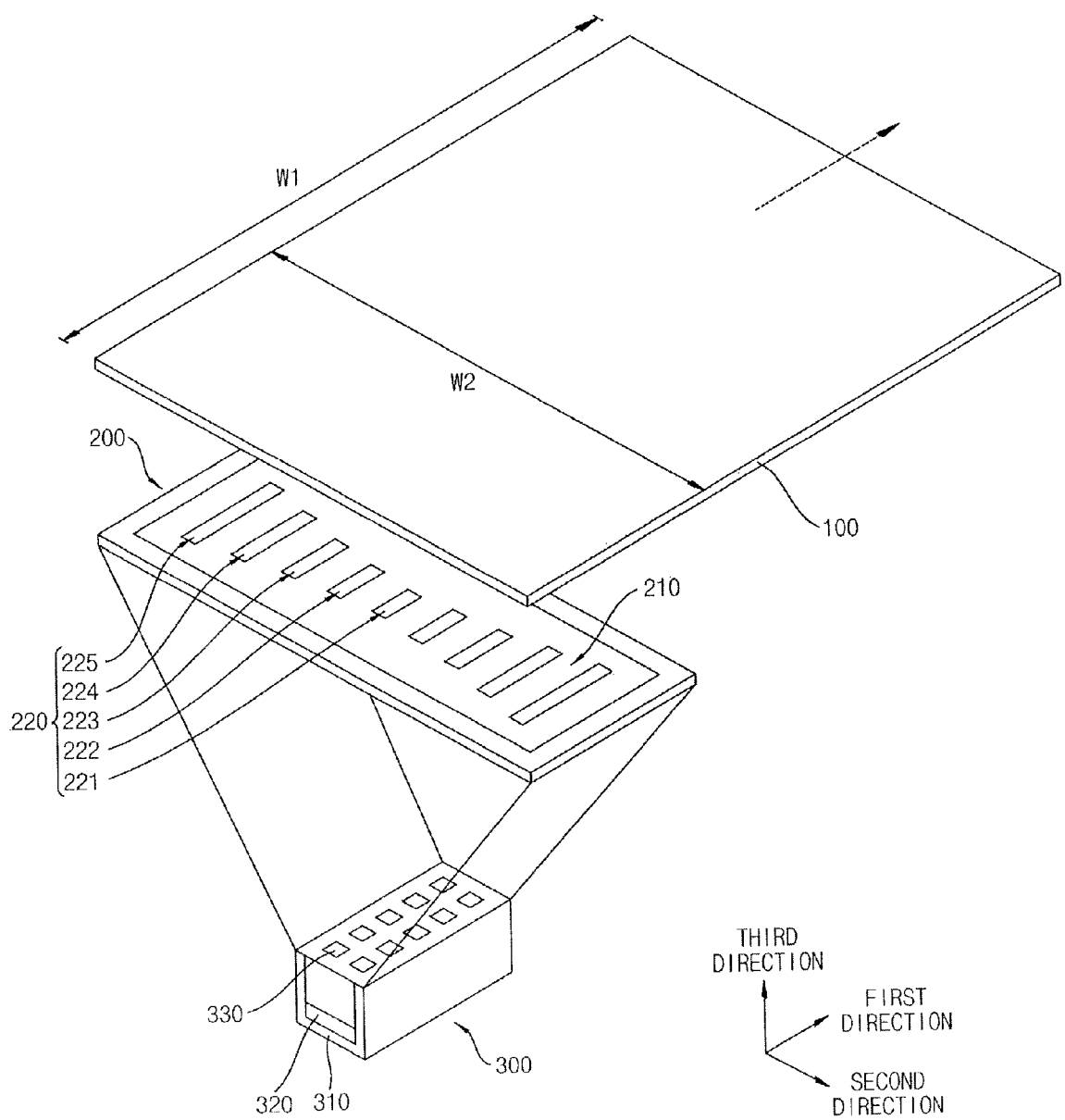
Figure 17:
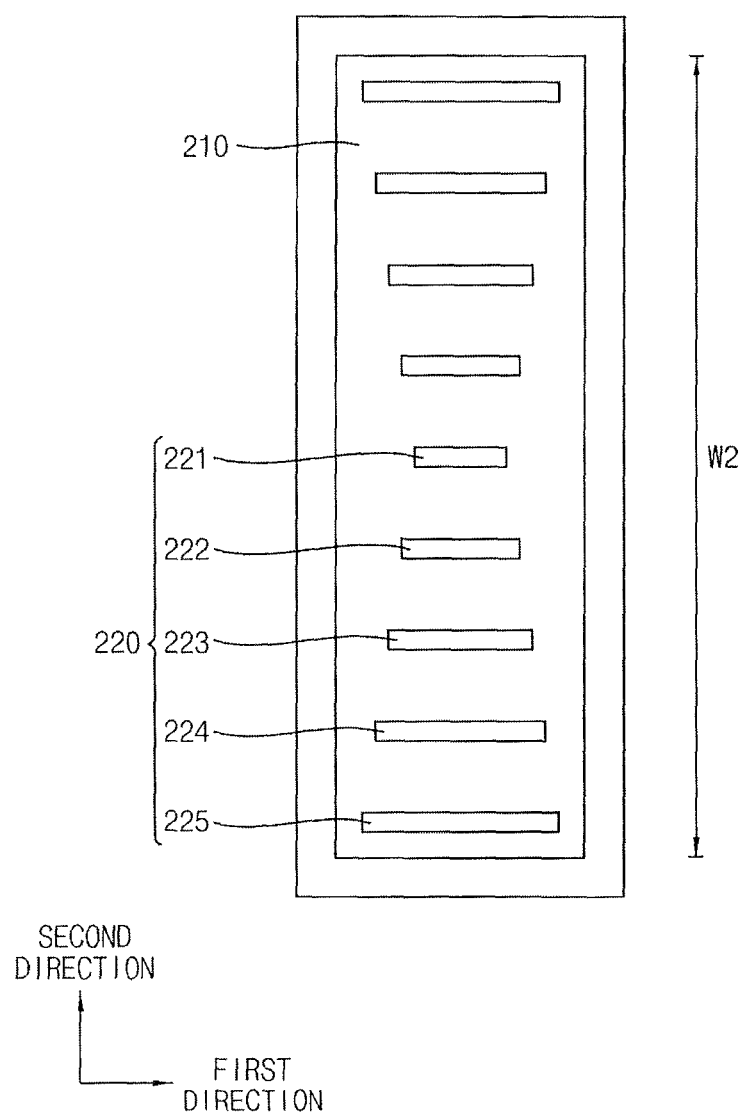

Referring to FIGS. 15 to 19, a first organic light emitting layer pattern 162 may be formed to overlap a plurality of first light emitting portions (I) by using a first mask structure 200. FIG. 15 illustrates an enlarged plan view of a method of manufacturing an organic light emitting display device in accordance with some example embodiments, FIG. 16 is a perspective view of a process for forming the first organic light emitting layer pattern 162, and FIG. 17 is a plan view of the first mask structure 200 in accordance with some example embodiments.

Referring to FIG. 17, the first mask structure 200 may include a mask body 210 and a plurality of openings 221, 222, 223, 224, and 225 penetrating the mask body 210. In example embodiments, the mask body 210 may have a planar shape extending in the second direction, and the mask body 210 may have the second width (W2) in the second direction. That is, the mask body 210 and the substrate 100 may have the same width (that is, the second width (W2) in the second direction). Further, the mask body 210 may have a width in the first direction that is smaller than the second width (W2).

The plurality of openings 221, 222, 223, 224, and 225 may be arranged in the second direction, such that the plurality of openings 221, 222, 223, 224, and 225 may be separated from each other in the second direction. In example embodiments, the first opening 221 disposed at a central portion of the mask body 210 may have a relatively small length in the first direction, and the fifth opening 225 disposed at an edge portion of the mask body 210 may have a relatively large length in the first direction. That is, lengths of the openings 221, 222, 223, 224, and 225 in the first direction may gradually increase from the central portion to the edge portion of the mask body 210 as illustrated in FIG. 17. Alternatively, the openings 221, 222, 223, 224, and 225 may have the same length in the first direction.

Referring to FIG. 16, the substrate 100 disposed above the deposition apparatus 300 and the first mask structure 200 may be transferred in the first direction during a deposition process. The deposition apparatus 300 may include a body 310 and a plurality of opening portions 330 disposed at a top surface of the body 310, and the body 310 may contain deposition particles 320. The deposition particles 320 may flow through the plurality of opening portions 330.

As the body 310 of the deposition apparatus 300 is heated, the deposition particles 320 in the body 310 may be emitted through the plurality of opening portions 330 in the third direction. The deposition particles 320 may pass through the openings 221, 222, 223, 224, and 225 of the first mask structure 200, and then may arrive at the substrate 100, thereby forming the first organic light emitting layer pattern 162 on the substrate 100.

The first organic light emitting layer pattern 162 may have a uniform thickness across the substrate 100. If the first mask structure 200 is omitted, the number of the deposition particles 320 arriving at a central portion of the substrate 100 may be greater than the number of the deposition particles 320 arriving at an edge portion of the substrate 100. However, the fifth opening 225 disposed at the edge portion of the mask body 210 may have an area greater than that of the first opening 221 disposed at a central portion of the mask body 210. That is, areas of the openings 221, 222, 223, 224, and 225 may be adjusted to control the number of the deposition particles 320 passing through the openings 221, 222, 223, 224, and 225, so that the first organic light emitting layer pattern 162 may have a uniform thickness at the central portion and the edge portion of the substrate 100. Further, the second width (W2) of the substrate 100 in the second direction may be smaller than the first width (W1) of the substrate 100 in the first direction. When the substrate 100 is transferred in the first direction relative to the first mask structure 200 during a deposition process, the uniformity of the thickness of the first organic light emitting layer pattern 162 may be improved, e.g., compared to transfer of the substrate 100 in the second direction relative to the first mask structure 200. Accordingly, the deposition process may be used to manufacture an organic light emitting display device having a large screen such as a monitor or a television.

Figure 18:
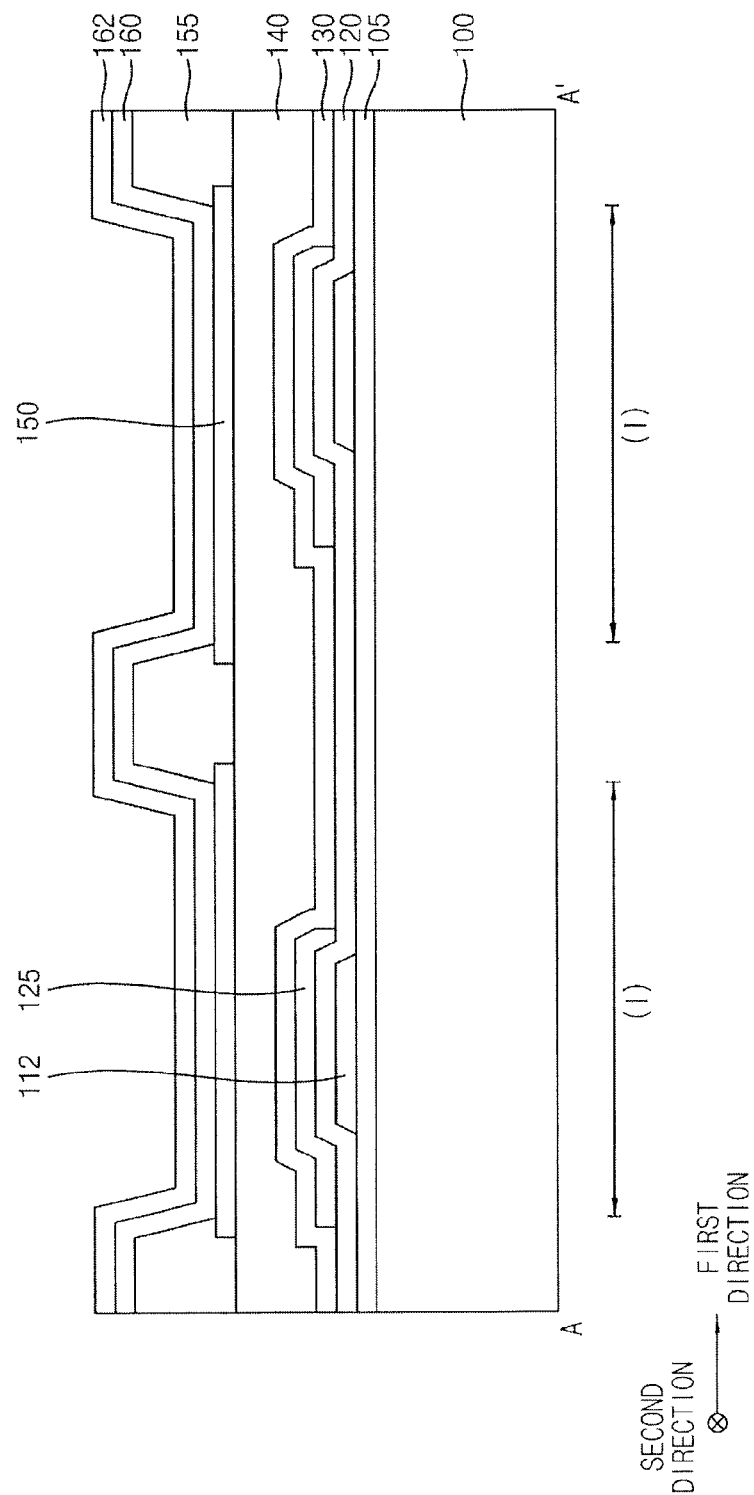
Figure 19:
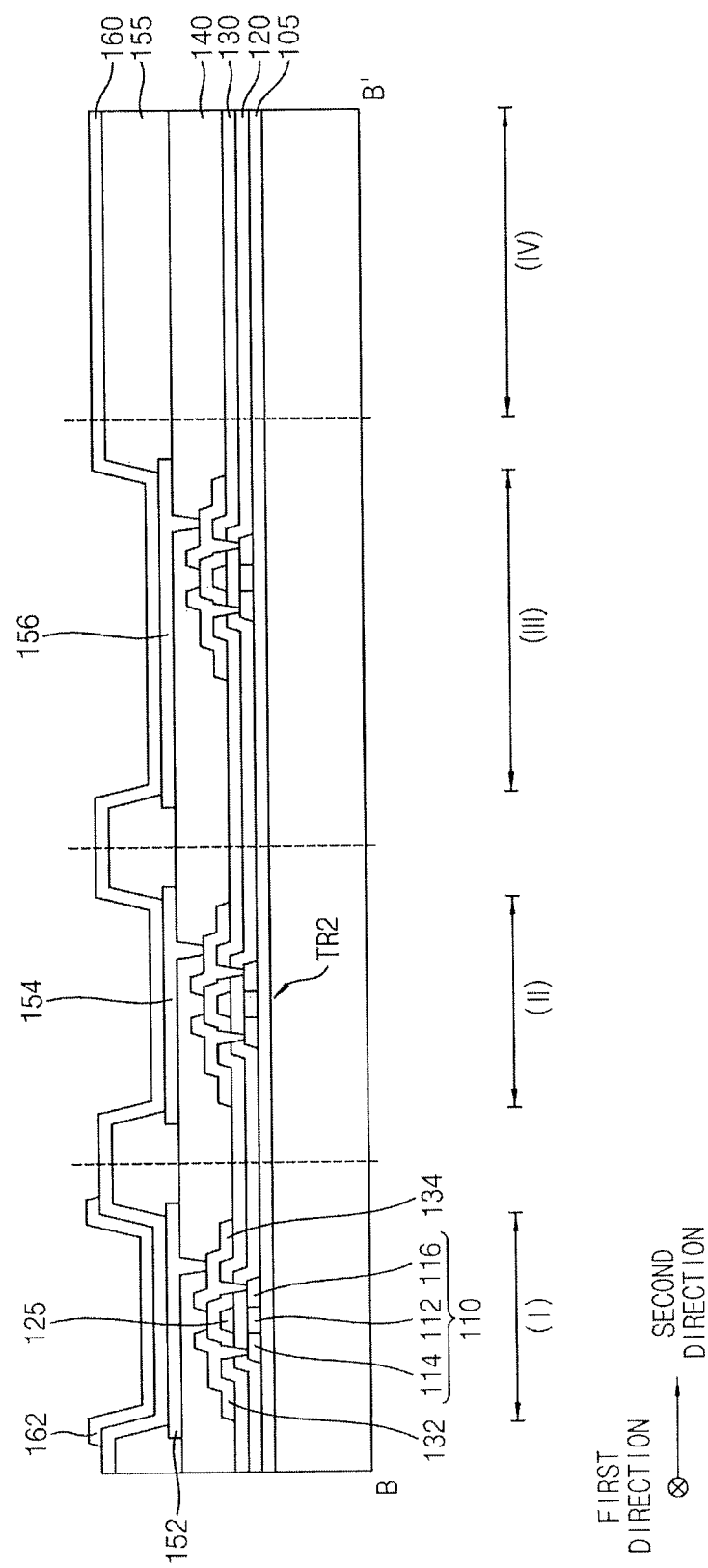

Referring now to FIGS. 15, 18, and 19, as the substrate 100 is transferred in the first direction relative to the first mask structure 200 during a deposition process, the first organic light emitting layer pattern 162 may be formed across the substrate 100 by using the first mask structure 200 which may have an area smaller than that of the substrate 100. Further, each of the first organic light emitting layer patterns 162 may be formed to overlap the plurality of first light emitting portion (I) of the plurality of pixel regions (P).

As mentioned above, when viewed from the first direction, the first light emitting portion (I) may not overlap the transmission portion (IV). Therefore, the first organic light emitting layer patterns 162 extending in the first direction and overlapping the first light emitting portion (I) may not overlap the transmission portion (IV). That is, external light passing through the transmission portion (IV) may not pass through the first organic light emitting layer pattern 162, so that transmittance of external light in the transmission portion (IV) may be increased, and a color shift problem due to the first organic light emitting layer pattern 162 may be prevented.

Figure 20:
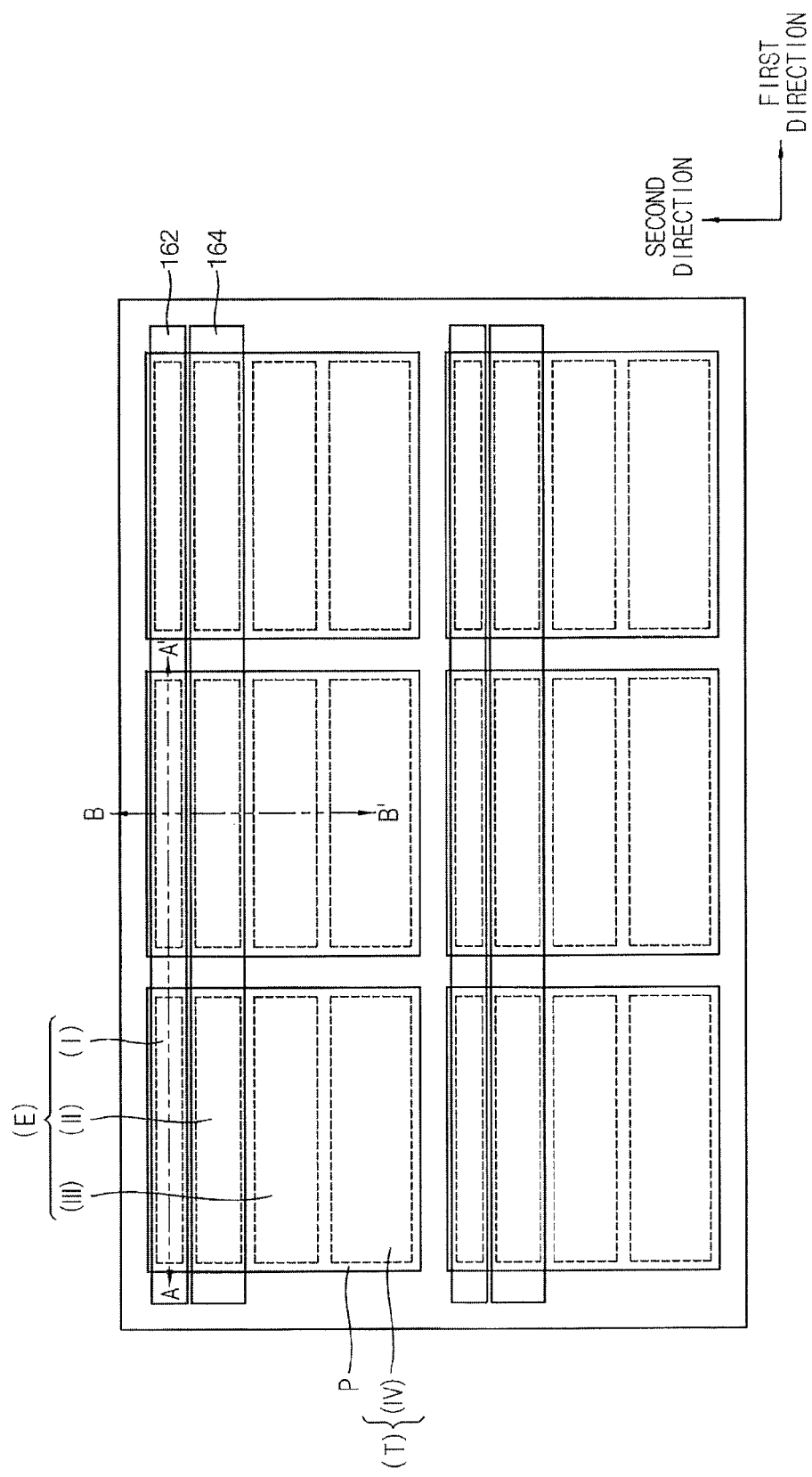
Figure 21:
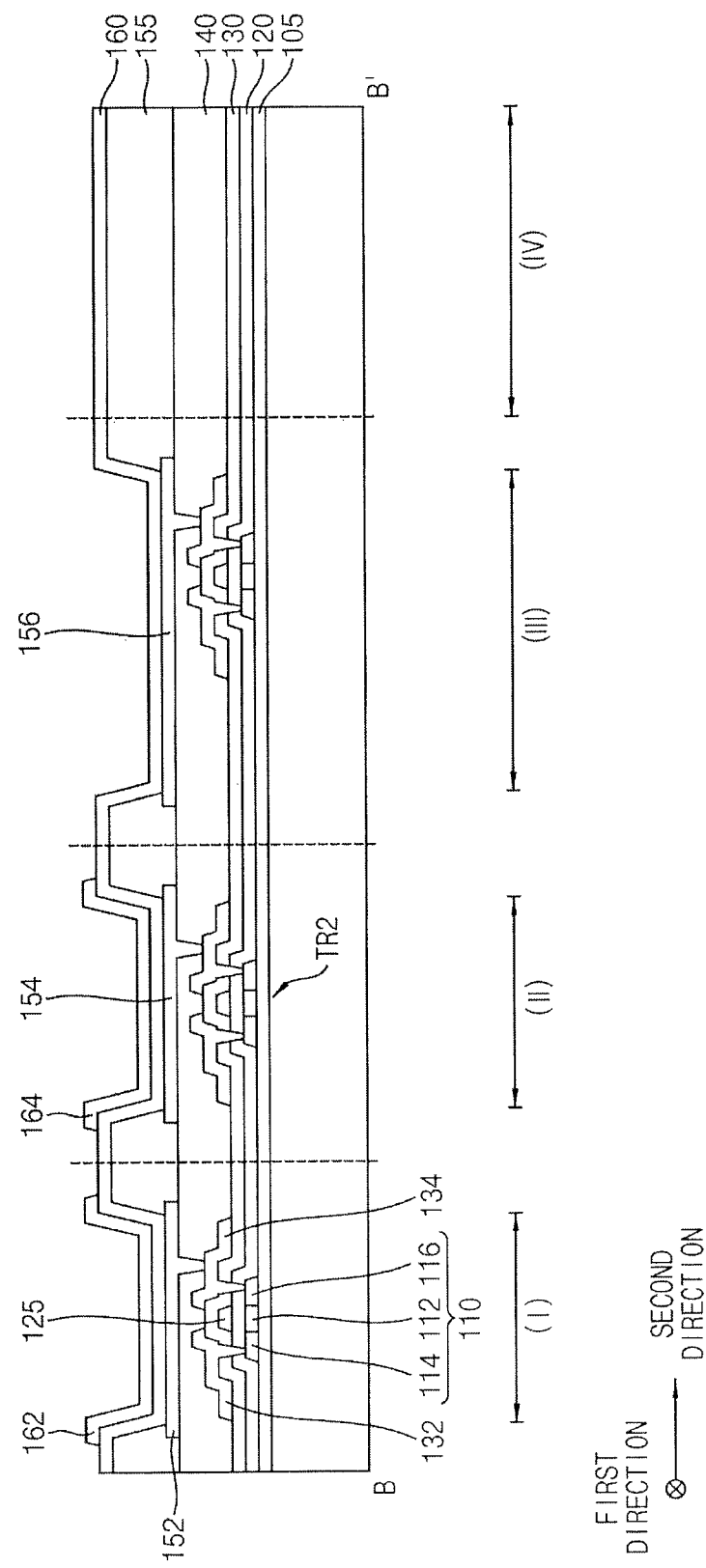

Referring to FIGS. 20 and 21, the second organic light emitting layer pattern 164 may be formed to overlap a plurality of second light emitting portions (II) by using a second mask structure. A process for forming the second organic light emitting layer pattern 164 may be substantially similar to those of the first organic light emitting layer pattern 162. However, the second organic light emitting layer pattern 164 and the first organic light emitting layer pattern 162 may include materials which may emit different colors of light. Further, the second organic light emitting layer pattern 164 may be formed to overlap the second light emitting portions (II), and not to overlap the transmission portion (IV).

Figure 22:
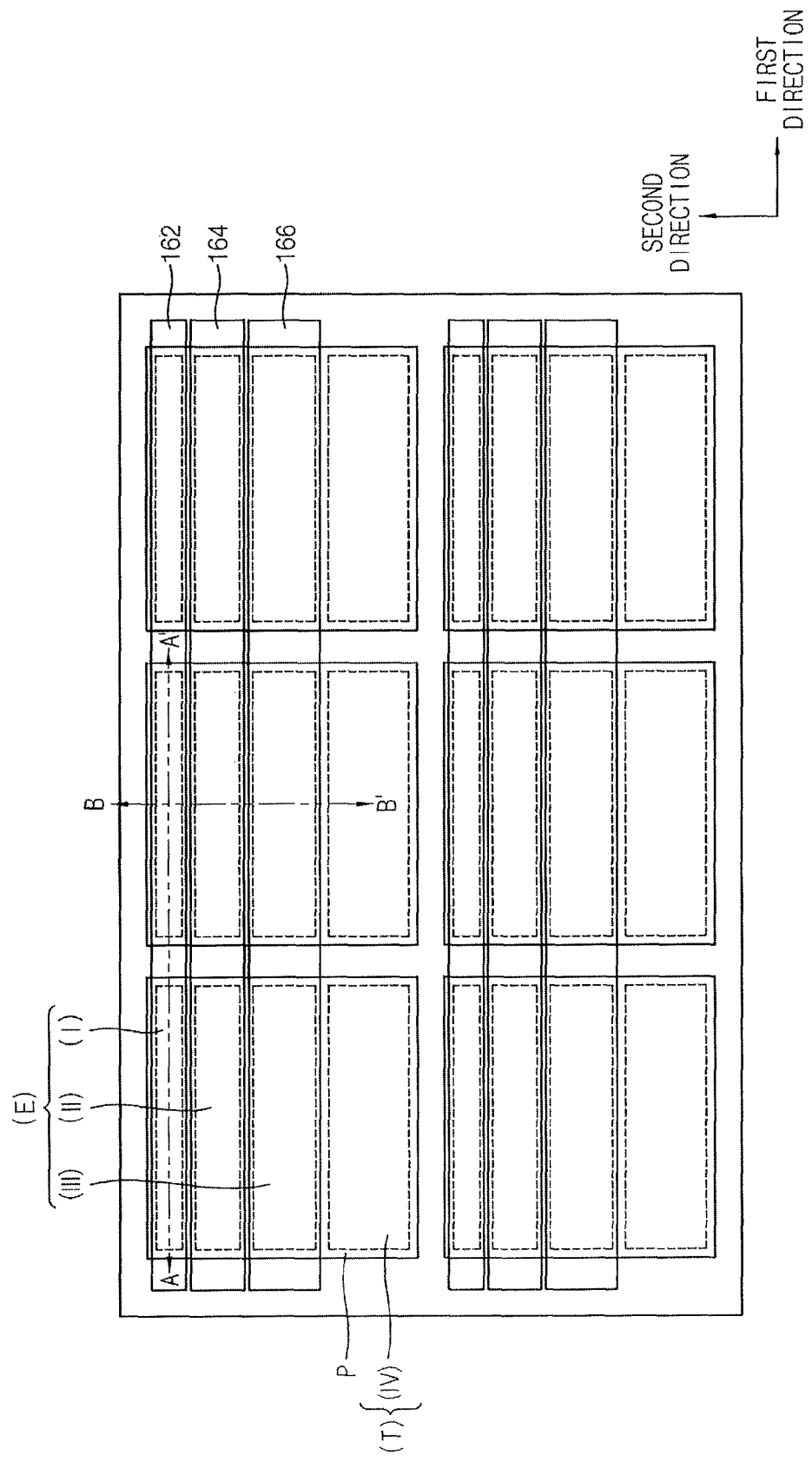
Figure 23:
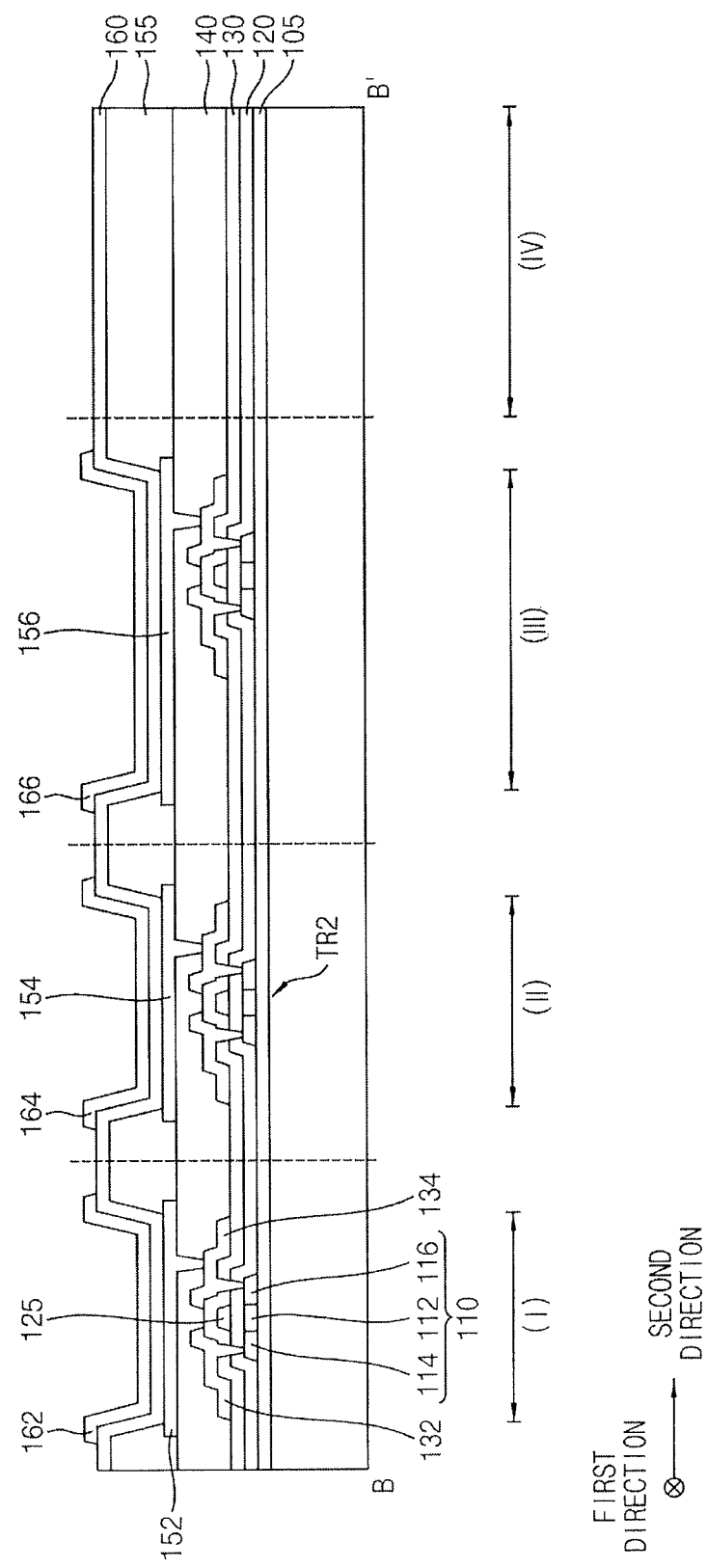

Referring to FIGS. 22 and 23, the third organic light emitting layer pattern 166 may be formed to overlap a plurality of third light emitting portions (III) by using a third mask structure. A process for forming the third organic light emitting layer pattern 166 may be substantially similar to those of the first organic light emitting layer pattern 162. However, the third organic light emitting layer pattern 166, the second organic light emitting layer pattern 164, and the first organic light emitting layer pattern 162 may include materials which may emit different colors of light. Further, the third organic light emitting layer pattern 166 may be formed to overlap the third light emitting portions (III), and not to overlap the transmission portion (IV)

Then, an upper electrode may be formed to manufacture the organic light emitting display device. According to example embodiments, when viewed from the first direction, the first light emitting portion (I), the second light emitting portion (II), and the third light emitting portion (III) may not overlap the transmission portion (IV), so that the first organic light emitting layer 162, the second organic light emitting layer pattern 164, and the third organic light emitting layer pattern 166 may not overlap the transmission portion (IV). That is, external light passing through the transmission portion (IV) may not pass through the organic light emitting layer patterns 162, 164, and 166, so that transmittance of external light of the transmission portion (IV) may be increased, and a color shift problem due to the organic light emitting layer patterns 162, 164 and 166 may be prevented.

Figure 24:
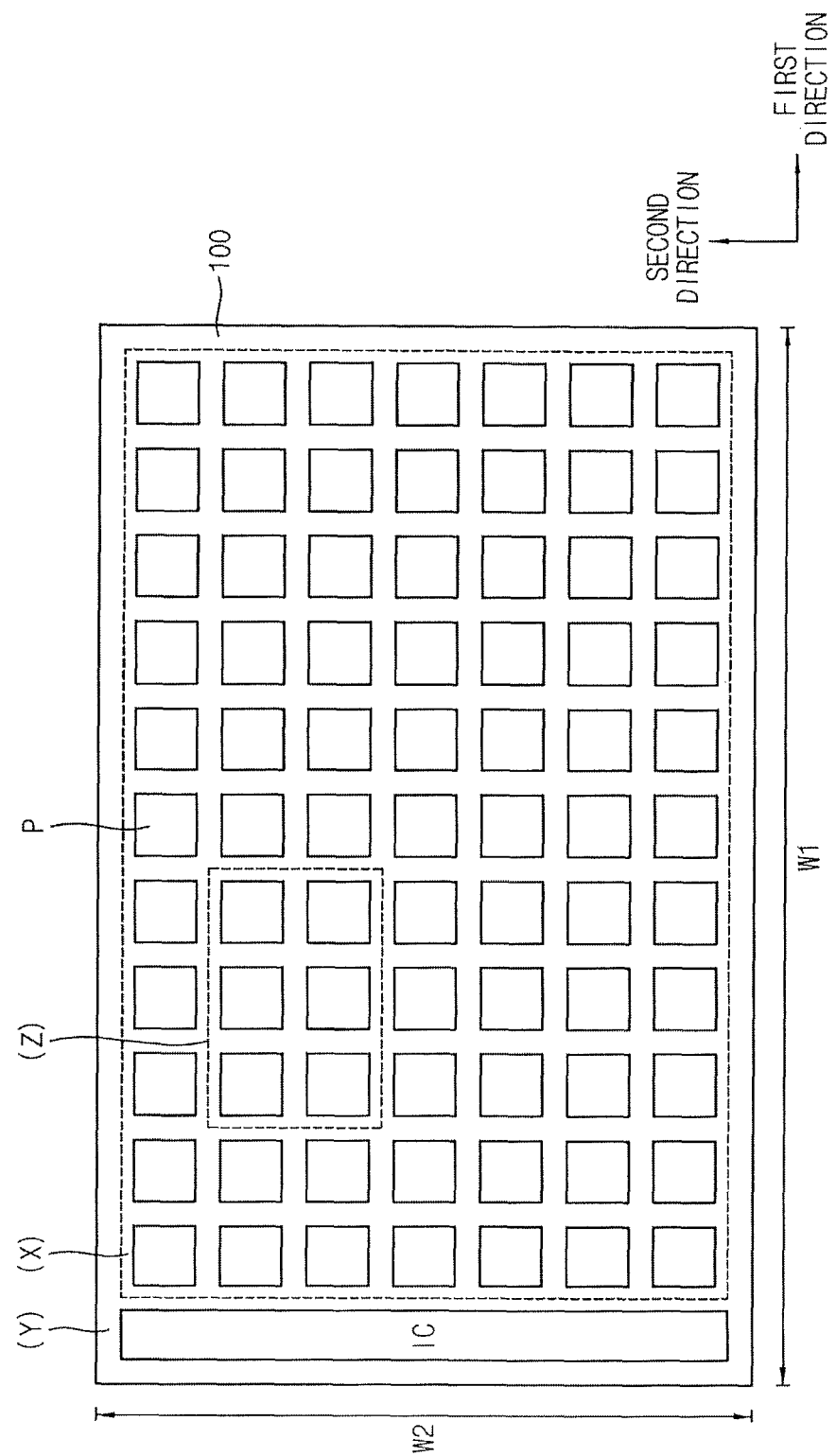
FIG. 24 illustrates a plan view of an organic light emitting display device in accordance with other example embodiments.

FIG. 24 illustrates a plan view of an organic light emitting display device in accordance with other example embodiments, and FIG. 25 is a plan view of an organic light emitting display device in accordance with yet other example embodiments. The organic light emitting display device may be substantially similar to those described with reference to FIGS. 1 to 7, except for arrangements of a driving circuit portion (IC) and lines.

Referring to FIG. 24, the substrate 100 of the organic light emitting display device may be divided in to the display region (X) and the peripheral region (Y). The driving circuit portion (IC) may be disposed in the peripheral region (Y) of the substrate 100. The driving circuit portion (IC) may include a data driver, a scan driver, a level shifter and a buffer circuit which may control and transfer electrical signals into the pixel regions (P). In example embodiments, the driving circuit portion (IC) may be disposed at a left side of the display region (X) as illustrated in FIG. 24. Further, the driving circuit portion (IC) may extend in the second direction. As the driving circuit portion (IC) may be disposed at a left side or a right side of the display region (X), arrangements and directions of to the scan line (S), the data line (D) and the Vdd line (V) may be different from those described with reference to FIGS. 1 to 7.

Referring to FIG. 25, the scan line (S), the data line (D), the Vdd line (V) may be electrically connected to the pixel circuits (C1, C2, C3). Single scan line (S) may be electrically connected to the first pixel circuit (C1), the second pixel circuit (C2) and the third pixel circuit (C3). That is, pixel circuits (C1, C2, C3) arranged in the same row may be electrically connected to the single scan line (S).

The first light emitting portion (I), the second light emitting portion (II), and the third light emitting portion (III) may be disposed adjacent to the transmission portion (IV), so that a first data line (D1), a second data line (D2) and a third data line (D3) electrically connected to the first pixel circuit (C1), the second pixel circuit (C2) and the third pixel circuit (C3), respectively, may be disposed adjacent to the transmission portion (IV). Referring to FIG. 25, the first data line (D1), the second data line (D2) and the third data line (D3) may be disposed at a left side of the transmission portion (IV). Therefore, the first data line (D1), the second data line (D2) and the third data line (D3) may not overlap the transmission portion (IV).

On the other hand, the first Vdd line (V1), the second Vdd line (V2), and the third Vdd line (V3) electrically connected to the first pixel circuit (C1), the second pixel circuit (C2), and the third pixel circuit (C3), respectively, may be disposed adjacent to the transmission portion (IV). Referring to FIG. 25, the first Vdd line (V1), the second Vdd line (V2), and the third Vdd line (V3) may be disposed at a right side of the transmission portion (IV). Therefore, the first Vdd line (V1), the second Vdd line (V2), and the third Vdd line (V3) may not overlap the transmission portion (IV). Accordingly, the lines (S. D1 D2, D3, V1, V2, V3) may be disposed not to overlap the transmission portion (IV), so that the lines (S, D1, D2, D3, V1, V2, V3) may not degrade transmittance of the transmission portion (IV).

Figure 26:
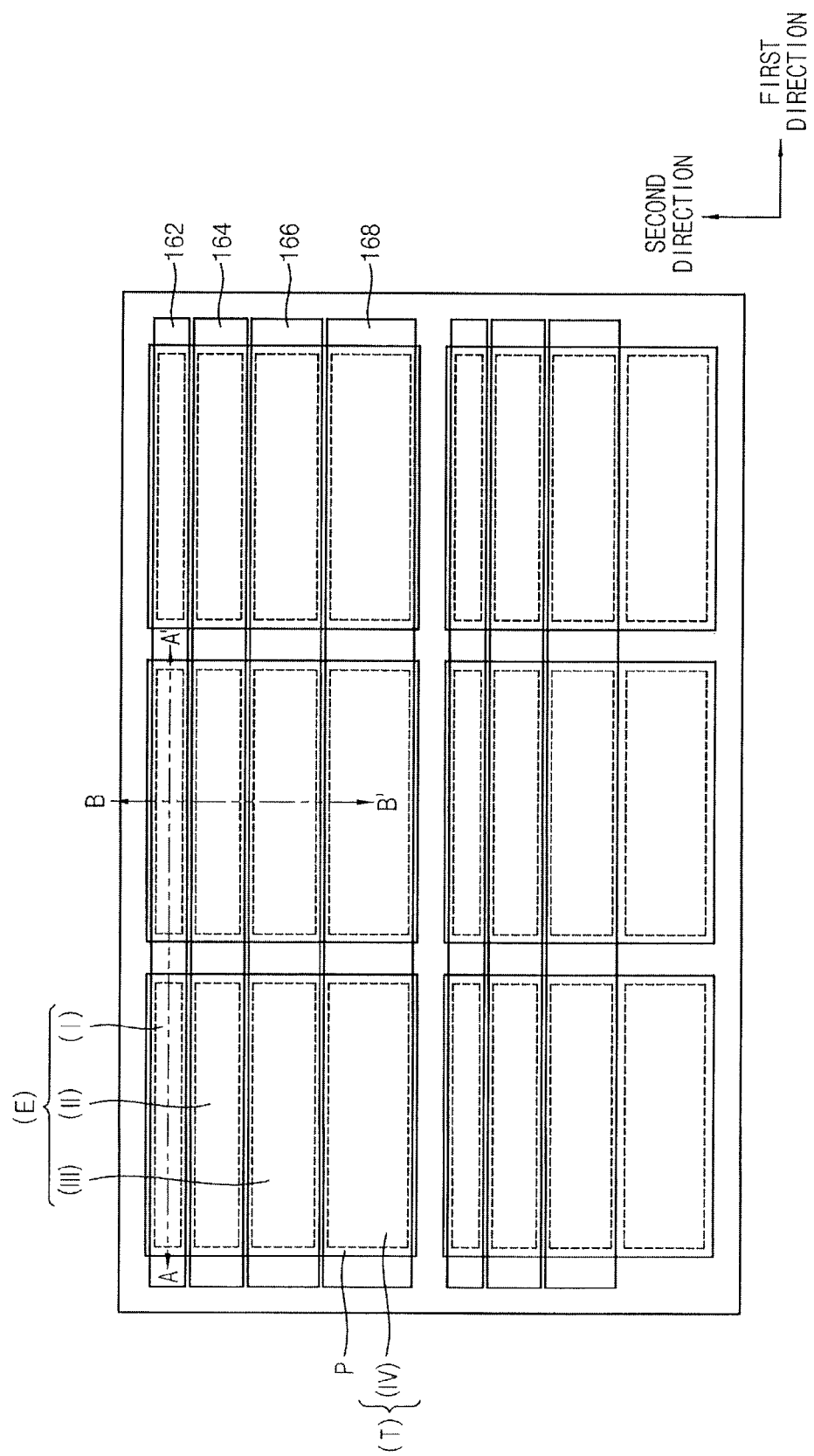
FIG. 26 illustrates a plan view of an organic light emitting display device in accordance with other example embodiments.
Figure 27:
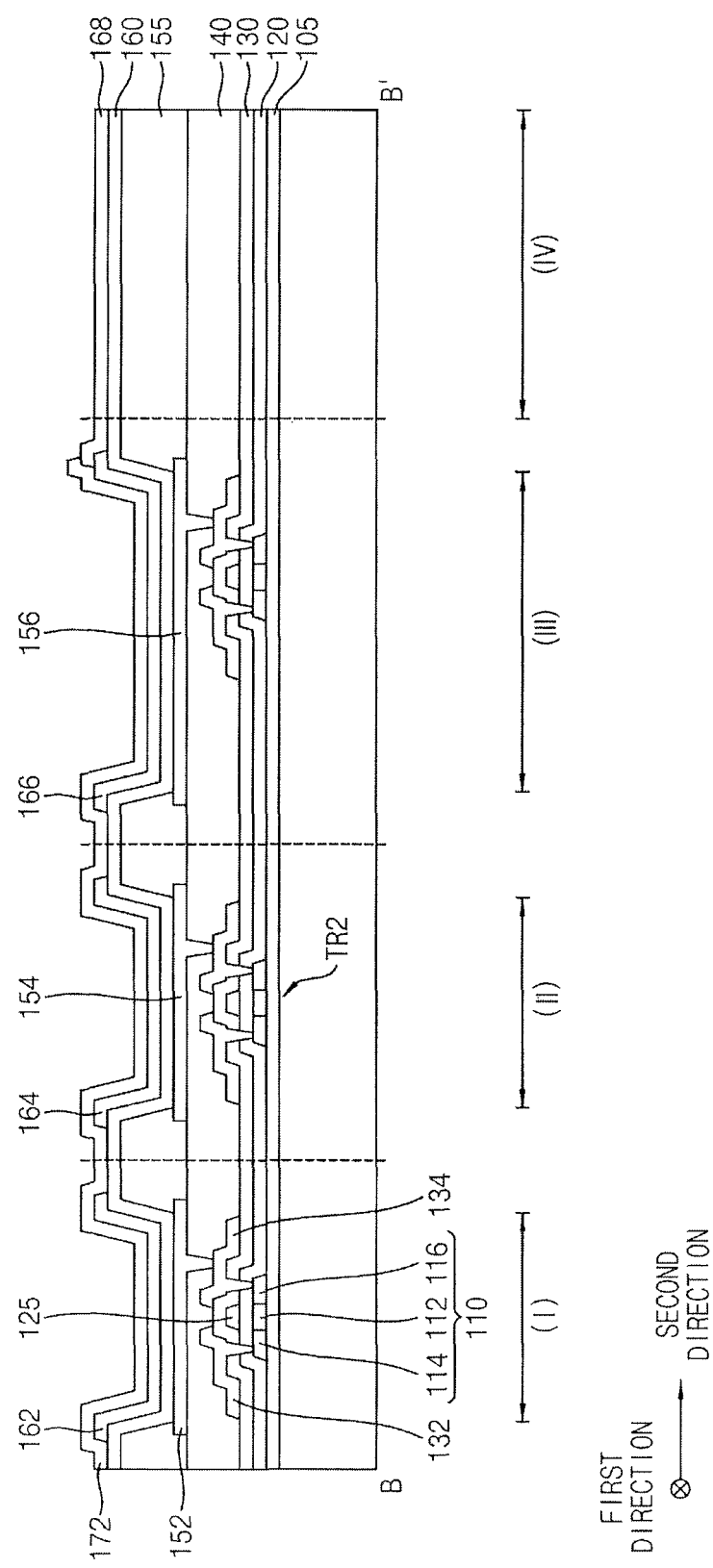
FIG. 27 illustrates a cross sectional view cut along a line B-B' of FIG. 26 in accordance with some example embodiments.

FIG. 26 illustrates a plan view of an organic light emitting display device in accordance with still other example embodiments, and FIG. 27 is a cross sectional view cut along line B-B' of FIG. 26 in accordance with some example embodiments. The organic light emitting display device may be substantially similar to those described with reference to FIGS. 1 to 7, except for an organic layer pattern 168 and an upper electrode 172.

Referring to FIGS. 26-27, pixel circuits including the thin film transistor (TR2) and a capacitor may be disposed on the substrate 100 in the first light emitting portion (I), the second light emitting portion (II), and the third light emitting portion (III), respectively. The second insulating interlayer 140 may be disposed to cover the pixel circuits.

The lower electrodes 152, 154 and 156 may be disposed on the second insulating interlayer 140, and the pixel defining layer 155 may be disposed on the second insulating interlayer 140 to partially cover the lower electrodes 152, 154 and 156. Further, the organic light emitting layer patterns 162, 164 and 166 may be disposed on top surfaces of the lower electrodes 152, 154 and 156 and a sidewall of the pixel defining layer 155, respectively.

The organic layer pattern 168 may be disposed on the pixel defining layer 155. The organic layer pattern 168 may extend in the first direction, and may cover a plurality of transmission portion (IV). In example embodiments, the organic layer pattern 168 may extend from the transmission portion (IV) into the third light emitting portion (III), so that the organic layer pattern 168 may partially overlap the third light emitting portion (III). Alternatively, the organic layer pattern 168 may not be disposed in the third light emitting portion (III).

The organic layer pattern 168 may include a material which may have a relatively weak adhesion characteristic with respect to the upper electrode 172. For example, the organic layer pattern 168 may include a transparent organic material such as lithium quinoline (LiQ). That is, the organic layer pattern 168 may have transmittance which is better than that of the upper electrode 172. Therefore, degradation of transmittance of the transmission portion (IV) by the organic layer pattern 168 may be reduced or minimized.

The upper electrode 172 may be disposed on the organic light emitting layer patterns 162, 164 and 166 and a hole transfer layer 160. However, the upper electrode 172 may not overlap the organic layer pattern 168, or may overlap an edge portion of the organic layer pattern 168. That is, the upper electrode 172 may not be disposed in the transmission portion (IV).

According to example embodiments, the upper electrode 172 may not overlap the transmission portion (IV), so that transmittance of the transmission portion (IV) may be improved. Further, the upper electrode 172 and the organic layer pattern 168 may have a relatively weak adhesion characteristic, so that the upper electrode 172 may be formed by a metal self patterning process without using a mask.

FIGS. 28 to 32 illustrate plan views, cross sectional views, and perspective views of a method of manufacturing an organic light emitting display device in accordance with some example embodiments.

Figure 28:
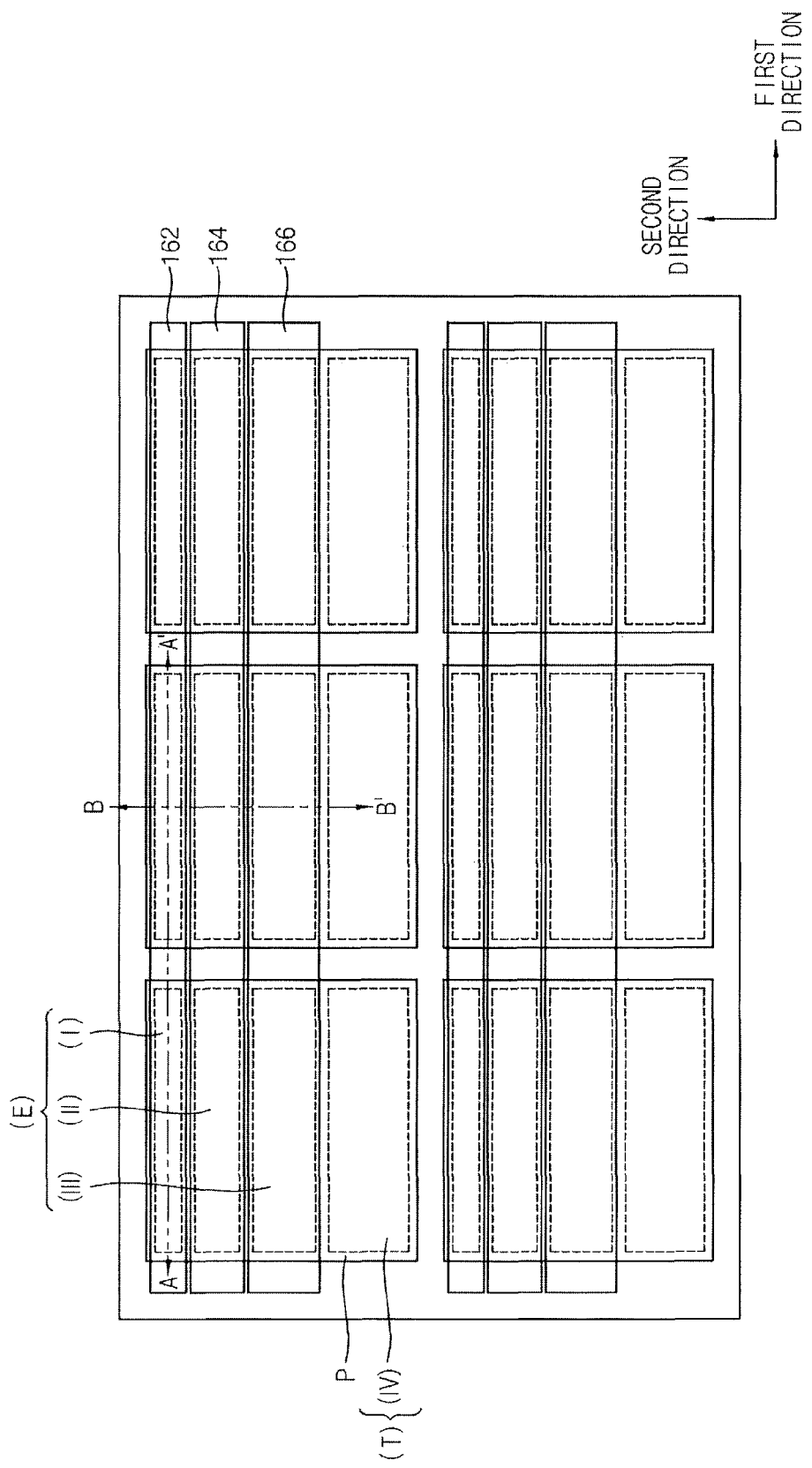
FIGS. 28 to 32 are plan views, cross sectional views and perspective views of stages in a method of manufacturing an organic light emitting display device in accordance with some example embodiments.

Referring to FIG. 28, processes described with reference to FIGS. 8 to 23 may be performed. That is, a pixel circuit including the thin film transistor (TR2) may be formed on the substrate 100, and the second insulating interlayer 140 may be formed to cover the pixel circuit. The lower electrodes 152, 154 and 156 and the pixel defining layer 155 may be formed on the second insulating interlayer 140, and then the hole transfer layer 160 may be formed on the lower electrodes 152, 154 and 156 and the pixel defining layer 155. While transferring the substrate 100 in the first direction, the first organic light emitting layer pattern 162 may be formed to overlap the first light emitting portion (I), the second organic light emitting layer pattern 164 may be formed to overlap the second light emitting portion (II), and the third organic light emitting layer pattern 166 may be formed to overlap the third light emitting portion (III).

Figure 29:
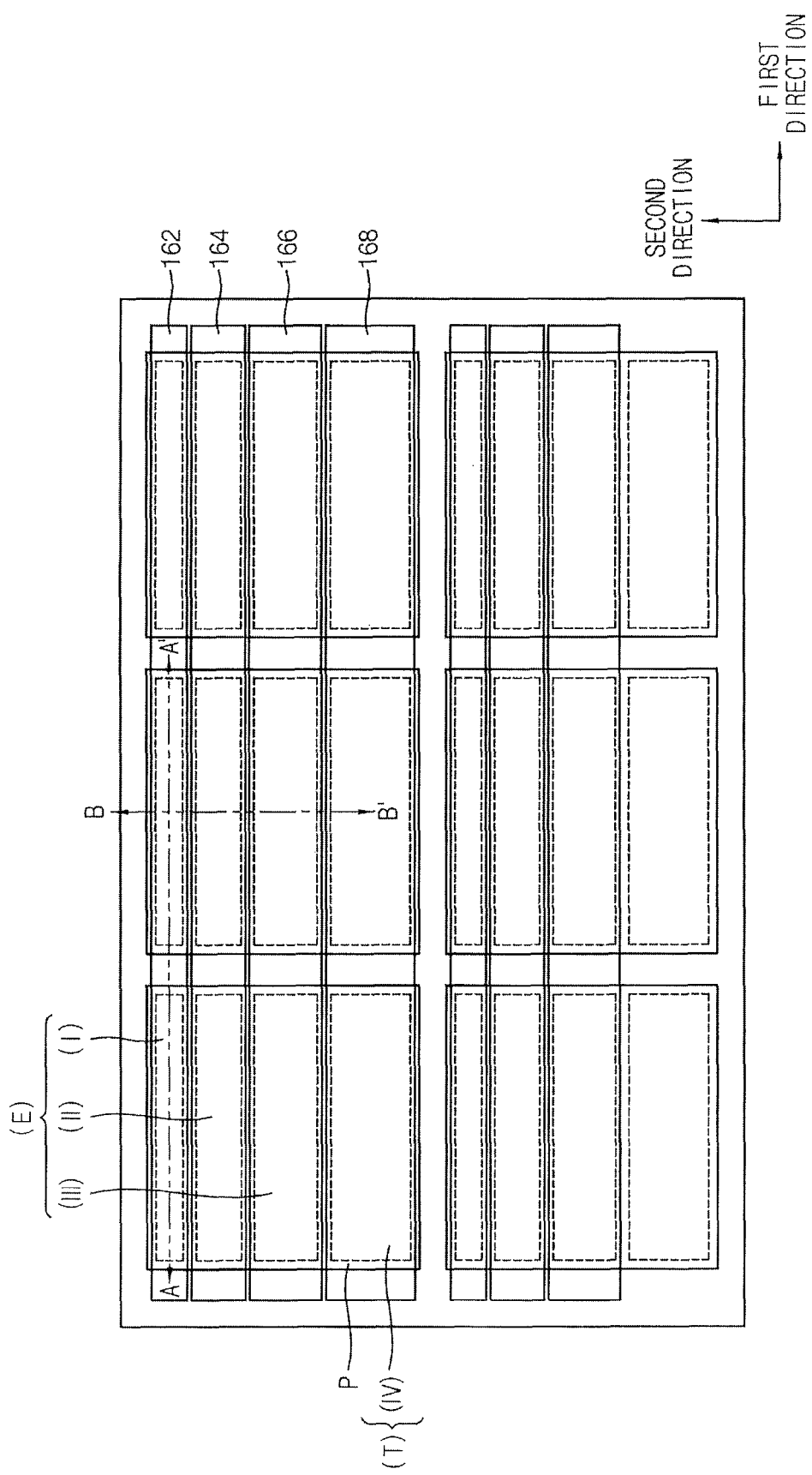
Figure 30:
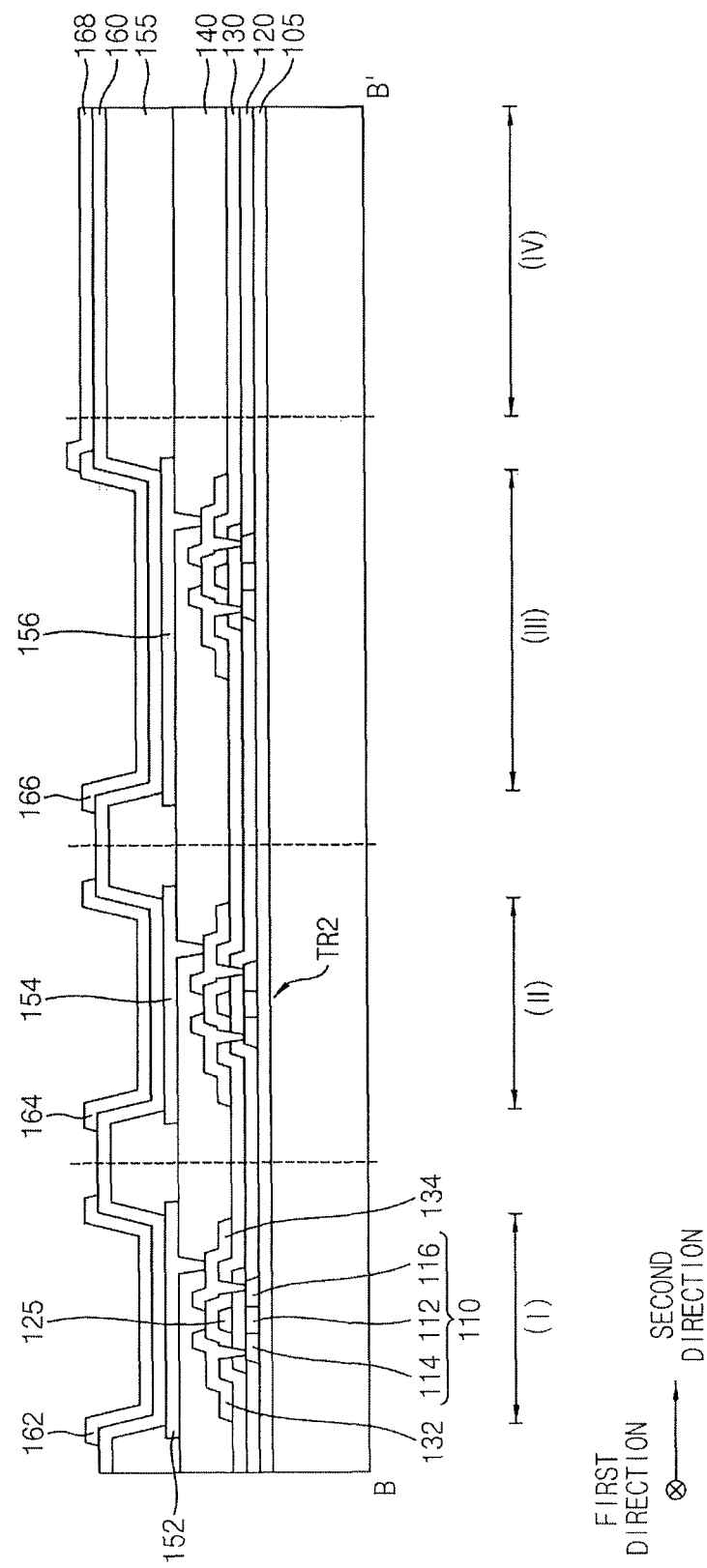
Figure 31:
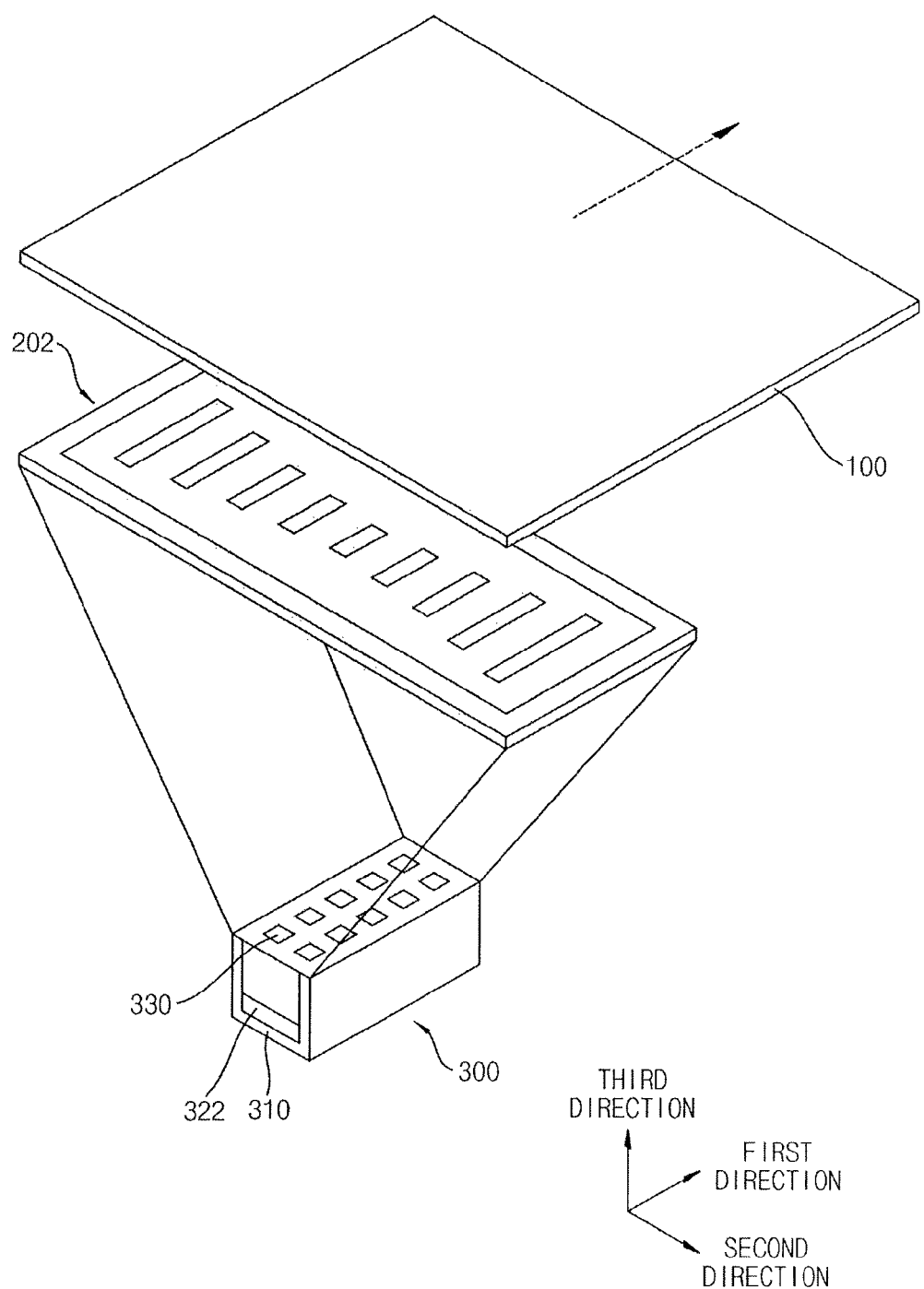

Referring to FIGS. 29 to 31, the organic layer pattern 168 may be formed to overlap the transmission portion (IV). A process for forming the organic layer pattern 168 may be substantially the same as or similar to those described with reference to FIGS. 15 to 19. That is, while transferring the substrate 100 in the first direction, deposition particles 322 emitted from the deposition apparatus 300 may pass through a fourth mask structure 202, and then may arrive at the substrate 100 to form the organic layer pattern 168.

In example embodiments, the deposition particles 322 may include a material which may have a relatively weak adhesion characteristic with respect to the upper electrode 172. For example, the deposition particles 322 may include a transparent organic material such as lithium quinoline (LiQ).

In example embodiments, the organic layer pattern 168 may be formed on the pixel defining layer 155. The organic layer pattern 168 may extend in the first direction, and may cover a plurality of transmission portion (IV). In example embodiments, the organic layer pattern 168 may extend from the transmission portion (IV) into the third light emitting portion (III), so that the organic layer pattern 168 may partially overlap the third light emitting portion (III). Alternatively, the organic layer pattern 168 may not disposed in the third light emitting portion (III).

Figure 32:
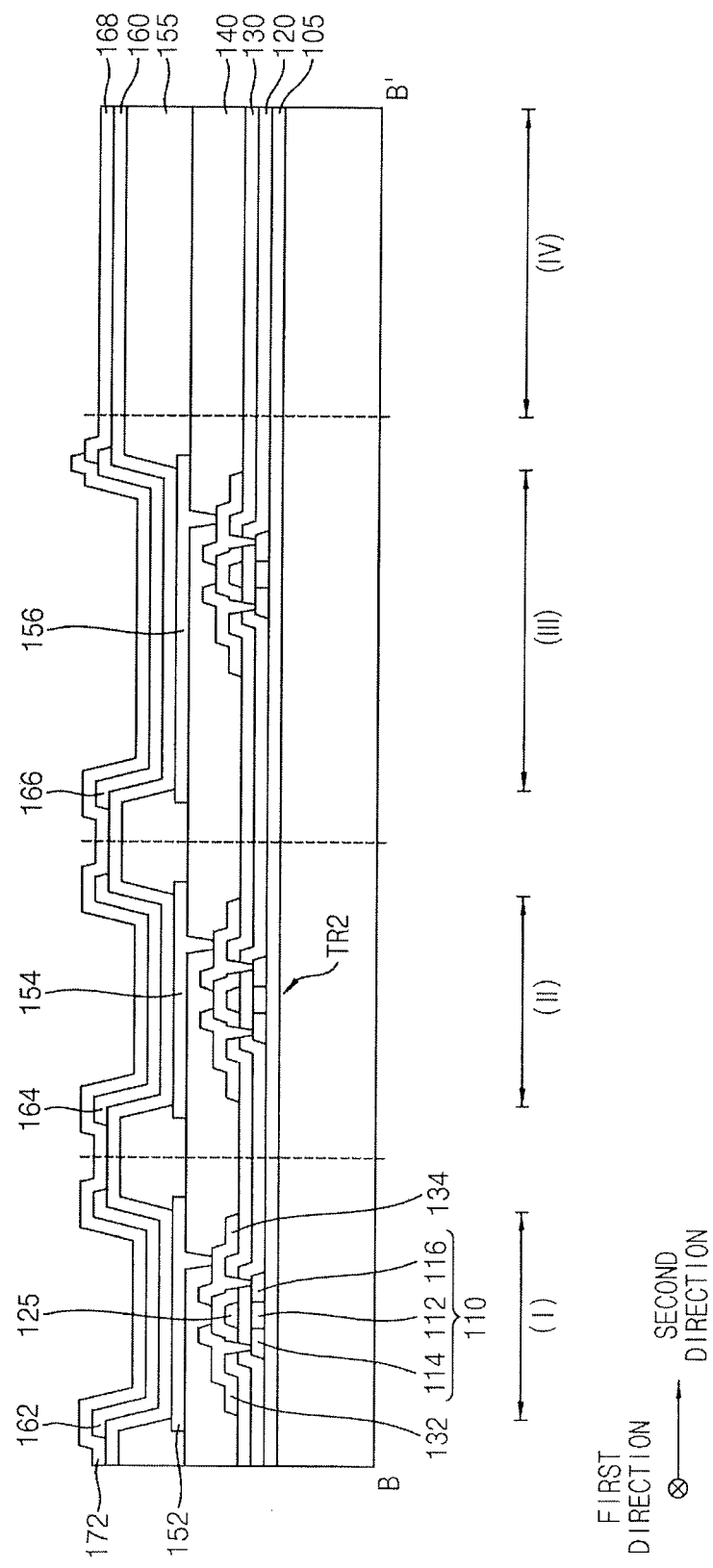

Referring to FIG. 32, an upper electrode 172 may be formed to overlap the first to third organic light emitting layer patterns 162, 164 and 166. In example embodiments, the upper electrode 172 may be formed using a metal such as aluminum (Al), platinum (Pt), silver (Ag), magnesium (Mg), gold (Au), chromium (Cr), tungsten (W), molybdenum (Mo), titanium (Ti) or an alloy thereof. The metal of the upper electrode 172 may have a relatively weak adhesion characteristic with respect to the organic layer pattern 168. Therefore, the upper electrode 172 may be formed not to overlap the organic layer pattern 168, or to overlap an edge portion of the organic layer pattern 168. Accordingly, the upper electrode 172 may not overlap the transmission portion (IV), so that transmittance in the transmission portion (IV) may be improved.

Figure 33:
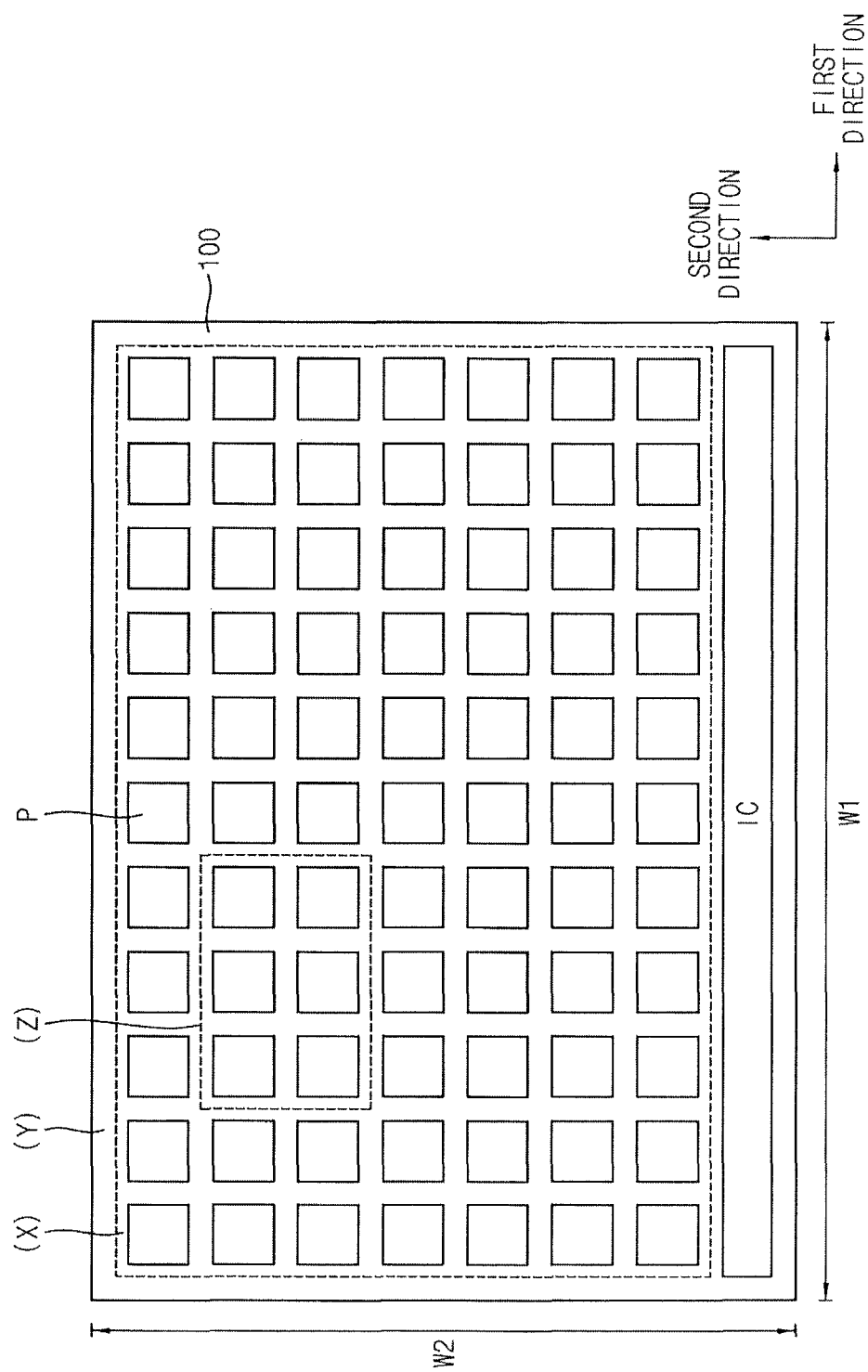
FIG. 33 illustrates a plan view of an organic light emitting display device in accordance with some example embodiments.
Figure 34:
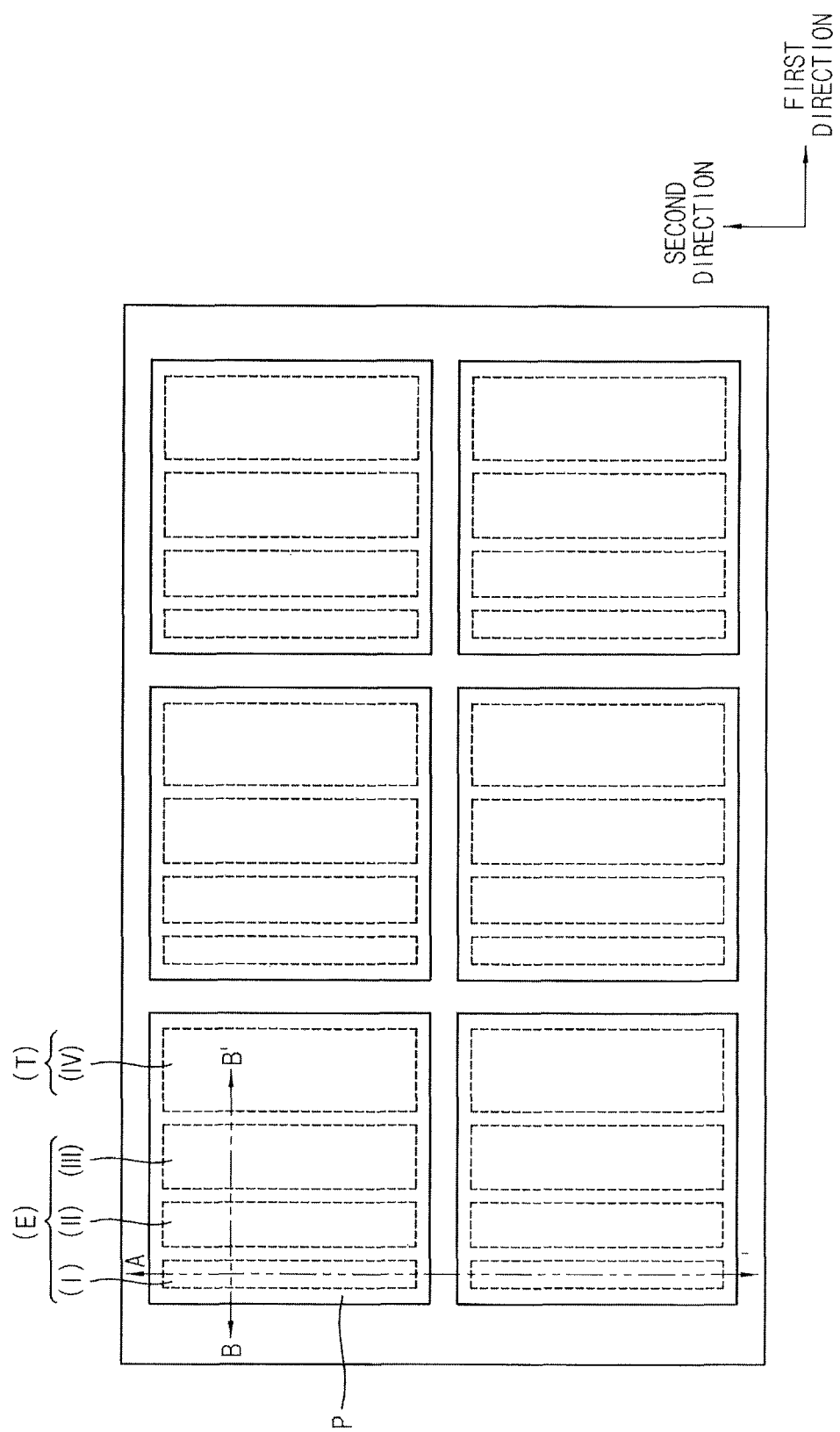
FIG. 34 illustrates an enlarged plan view of FIG. 33.

FIG. 33 illustrates a plan view of an organic light emitting display device in accordance with some example embodiments, and FIG. 34 is an enlarged plan view of FIG. 33. Referring to FIG. 33, the substrate 100 of the organic light emitting display device may be divided in to the display region (X) and the peripheral region (Y).

In example embodiments, the display region (X) may be disposed at a center of the substrate 100, and the peripheral region (Y) may be disposed at edges of the substrate 100. That is, the peripheral region (Y) may surround at least one side of the display region (X).

The substrate 100 of the organic light emitting display device may have a first width W1 in a first direction, and may have a second width W2 in a second direction. In example embodiment, the first width W1 may be greater than a second width W2. That is, the substrate 100 may have a rectangular shape which may extend in the first direction.

On the other hand, the driving circuit portion (IC) may be disposed in the peripheral region (Y) of the substrate 100. The driving circuit portion (IC) may include a data driver, a scan driver, a level shifter and a buffer circuit which may control and transfer electrical signals into the pixel regions (P). In example embodiments, the driving circuit portion (IC) may be disposed at a lower side or an upper side of the display region (X). Further, the driving circuit portion (IC) may extend in the first direction as illustrated in FIG. 33.

Referring to FIGS. 33 and 34, the plurality of pixel regions (P) may be disposed in the display region (X) of the substrate 100. The plurality of pixel regions (P) may be arranged in the first direction and the second direction. Each of the pixel regions (P) may include a first region (E) and a second region (T), the first region (E) may include a first light emitting portion (I), a second light emitting portion (II) and a third light emitting portion (III), and the second region (T) may include a transmission portion (IV).

In example embodiments, the first light emitting portion (I), the second light emitting portion (II) and the third light emitting portion (III) may correspond to a red light, a green light and a blue light. That is, light emitting structures disposed in the first to third light emitting portions (I, II, III) may generate the red light, the green light and the blue light.

In example embodiments, each of the first light emitting portion (I), the second light emitting portion (II) and the third light emitting portion (III) may have a polygonal shape extending in the second direction. That is, a length of the first light emitting portion (I) in the second direction may be greater than a width of the first light emitting portion (I) in the first direction, a length of the second light emitting portion (II) in the second direction may be greater than a width of the second light emitting portion (II) in the first direction, and a length of the third light emitting portion (III) in the second direction may be greater than a width of the third light emitting portion (III) in the first direction.

The first light emitting portion (I), the second light emitting portion (II) and the third light emitting portion (III) may be sequentially arranged in the first direction. That is, the first light emitting portion (I), the second light emitting portion (II) and the third light emitting portion (III) may be spaced apart from each other in the first direction. When viewed from the second direction, the first light emitting portion (I), the second light emitting portion (II) and the third light emitting portion (III) may not overlap each other.

Further, the transmission portion (IV) may be spaced apart from the third light emitting portion (III) in the first direction. In example embodiment, the transmission portion (IV) may occupy a ratio in the range of about 20% to about 90% with respect to an area of the pixel region (P).

Referring now to FIG. 34, the first light emitting portions (I), the second light emitting portions (II), the third light emitting portions (III) and the transmission portions (IV) of adjacent pixel regions (P) may be arranged in the second direction. That is, the first light emitting portions (I) of adjacent pixel regions (P) may be arranged in the second direction. The second light emitting portions (II) of adjacent pixel regions (P) may be arranged in the second direction. The third light emitting portions (III) of adjacent pixel regions (P) may be arranged in the second direction. Further, the transmission portions (IV) of adjacent pixel regions (P) may be arranged in the second direction. Accordingly, when viewed from the second direction, the transmission portion (IV) may not overlap the first light emitting portion (I), the second light emitting portion (II) and the third light emitting portion (III).

Further, an organic light emitting structure and a pixel circuit for electrically controlling the organic light emitting structure may be disposed in each of the first light emitting portion (I), the second light emitting portion (II) and the third light emitting portion (III).

Figure 35:
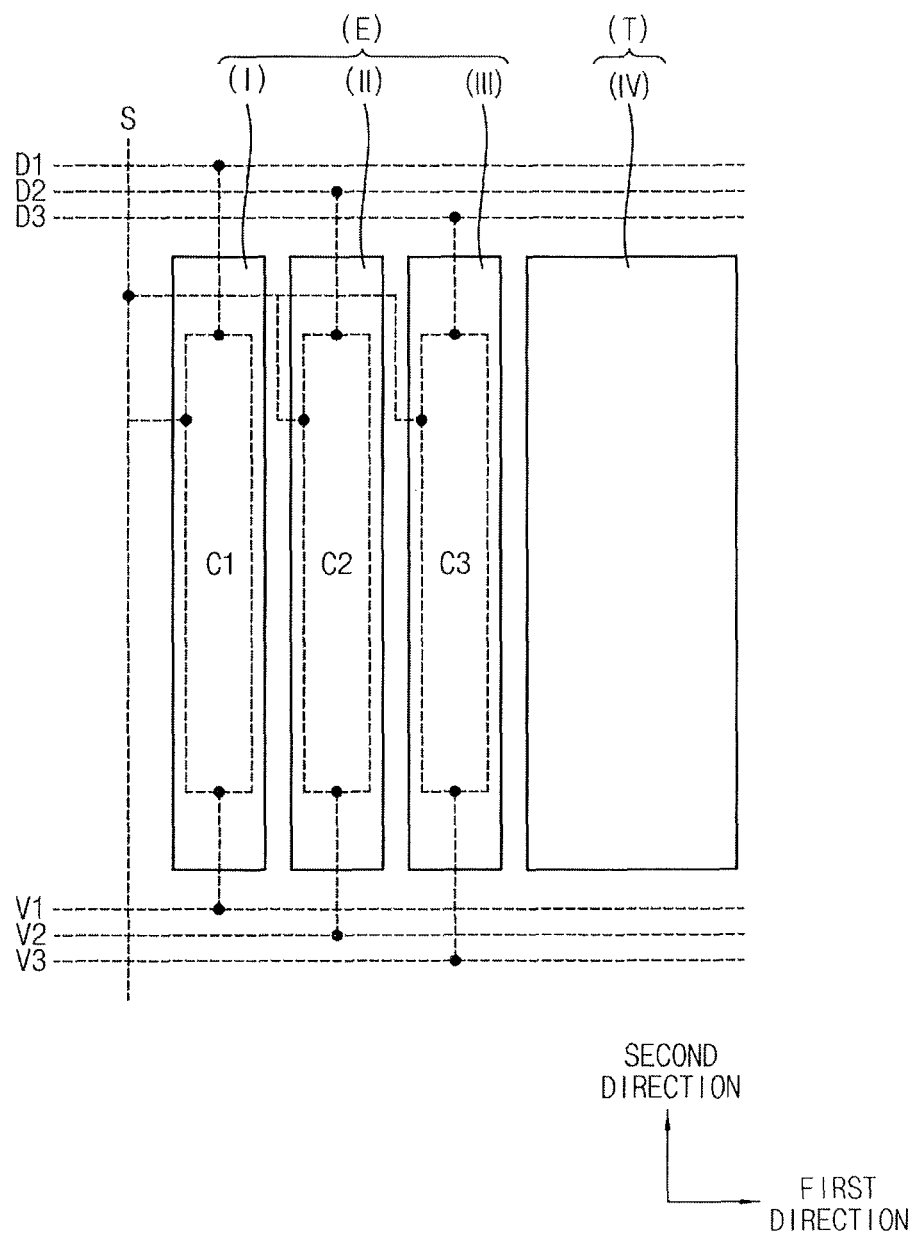
FIG. 35 illustrates a schematic view of a pixel circuit of an organic light emitting display device in accordance with some example embodiments.

FIG. 35 illustrates a schematic view illustrating a pixel circuit of an organic light emitting display device in accordance with some example embodiments.

Referring to FIG. 35, a scan line (S), a data line (D1, D2, D3), a Vdd line (V1, V2, V3) may be electrically connected to the pixel circuit (C1, C2, C3). In example embodiments, other lines may be electrically connected to the pixel circuit (C1, C2, C3) depending on a structure of the pixel circuit (C1, C2, C3).

In example embodiments, single scan line (S) may be electrically connected to the first pixel circuit (C1), the second pixel circuit (C2) and the third pixel circuit (C3). That is, pixel circuits (C1, C2, C3) arranged in the same column may be electrically connected to the single scan line (S). The first pixel circuit (C1), the second pixel circuit (C2) and the third pixel circuit (C3) may be disposed in the first light emitting portion (I), the second light emitting portion (II) and the third light emitting portion (III), respectively.

The first pixel circuit (C1), the second pixel circuit (C2) and the third pixel circuit (C3) may not disposed in the transmission portion (IV), so that the first pixel circuit (C1), the second pixel circuit (C2) and the third pixel circuit (C3) may not degrade transmittance of the transmission portion (IV).

The first data line (D1), the second data line (D2) and the third data line (D3) electrically connected to the first pixel circuit (C1), the second pixel circuit (C2) and the third pixel circuit (C3), respectively, may be disposed adjacent to the transmission portion (IV). Referring to FIG. 35, the first data line (D1), the second data line (D2) and the third data line (D3) may be disposed above the transmission portion (IV), so that the first data line (D1), the second data line (D2) and the third data line (D3) may not overlap the transmission portion (IV).

Further, the first Vdd line (V1), the second Vdd line (V2) and the third Vdd line (V3) may be disposed adjacent to the transmission portion (IV). However, the first Vdd line (V1), the second Vdd line (V2) and the third Vdd line (V3) may not overlap the transmission portion (IV), so that the first Vdd line (V1), the second Vdd line (V2) and the third Vdd line (V3) may not degrade transmittance of the transmission portion (IV).

Figure 36:
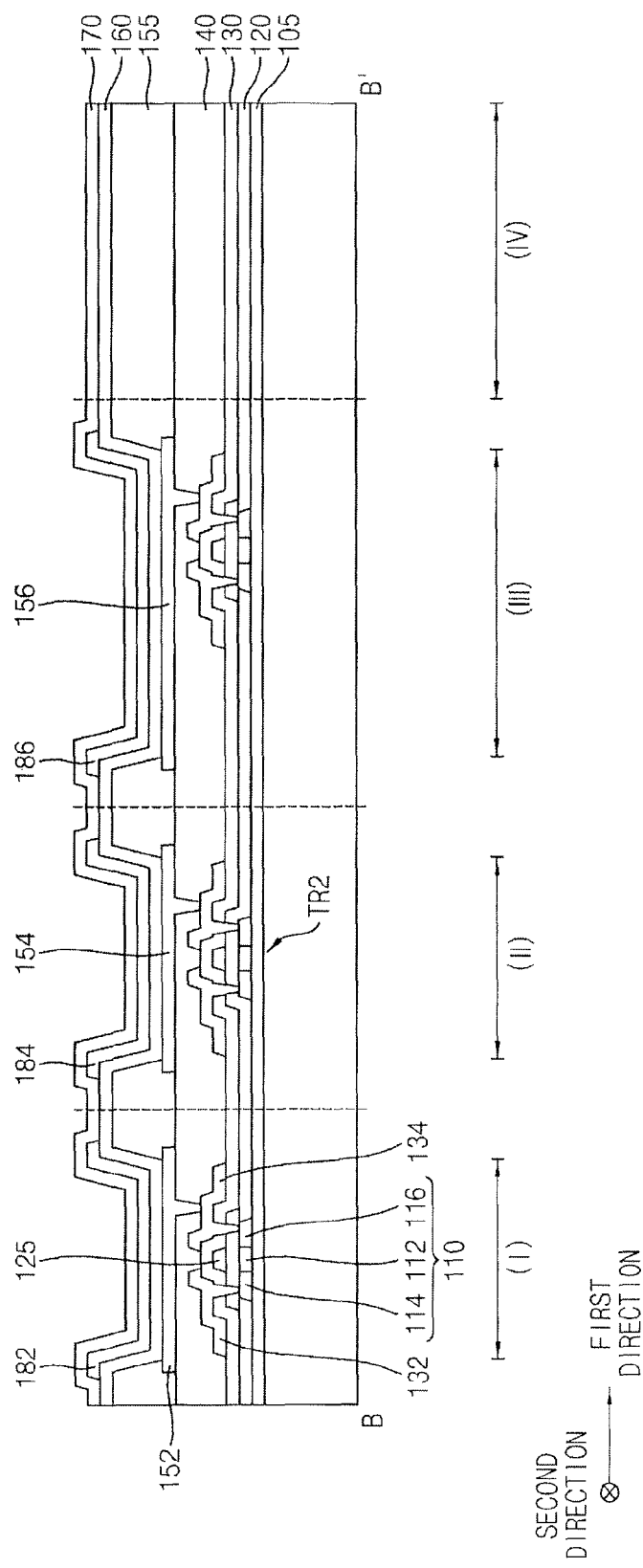
FIG. 36 illustrates a cross sectional view cut along a line B-B' of FIG. 35 in accordance with some example embodiments.
Figure 37:
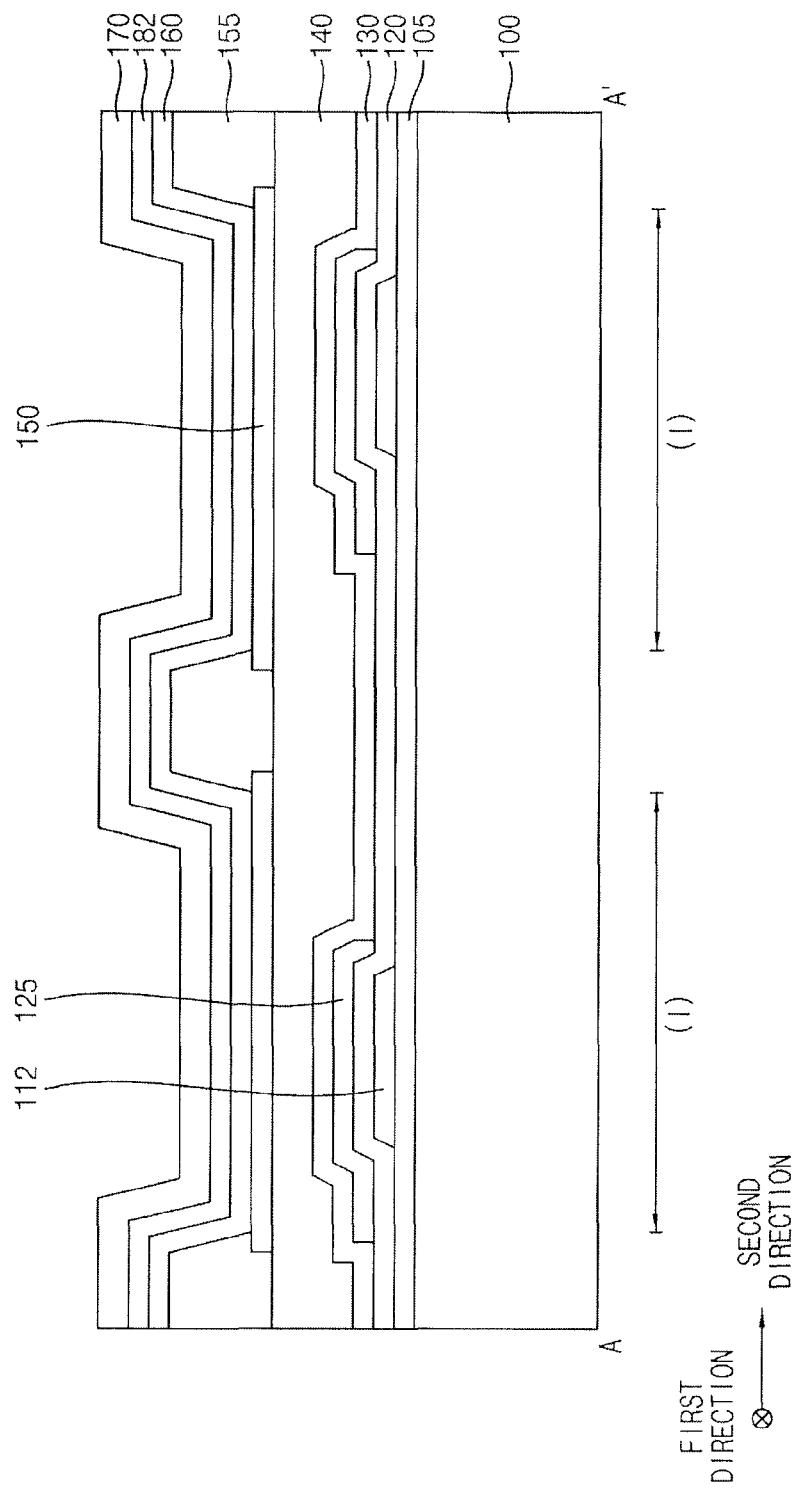
FIG. 37 illustrates a cross sectional view cut along a line A-A' of FIG. 35 in accordance with some example embodiments.

FIG. 36 illustrates a cross sectional view cut along a line B-B' of FIG. 35 in accordance with some example embodiments and FIG. 37 is a cross sectional view cut along a line A-A' of FIG. 35 in accordance with some example embodiments.

Referring to FIGS. 36 and 37, the pixel circuits and the light emitting structures may be disposed on the light emitting portions (I, II, III) of the substrate 100.

The organic light emitting display device may include the substrate 100, a switching structure of the pixel circuit, lower electrodes 152, 154 and 156, the light emitting structures, and upper electrodes 170.

The substrate 100 may include a transparent insulation substrate. For example, the substrate 100 may include a glass substrate, a quartz substrate, a transparent resin substrate, or the like. Alternatively, the substrate 100 may include a flexible substrate.

The buffer layer 105 may be disposed on the substrate 100. The buffer layer 105 may provide a flat top surface, and may prevent impurities from diffusing into the substrate 100. Transistors and capacitors constituting the pixel circuit may be disposed on the buffer layer 105. The pixel circuits may be disposed in the first light emitting portion (I), the second light emitting portion (II) and the third light emitting portion (III), respectively.

For convenience of description, the second transistor (TR2) is illustrated in FIGS. 36 and 37, however the first transistor (not shown) and the capacitor (not shown) may be further disposed on the buffer layer 105. The second thin film transistor (TR2) may include a active pattern 110, a gate electrode 125, a source electrode 132 and a drain electrode 134.

The active pattern 110 may include oxide semiconductor, polysilicon, doped polysilicon, amorphous silicon, doped amorphous silicon, and the like. Further, the active portion 110 may include a channel region 112, a source region 114 and a drain region 116. The source region 114 and the drain region 116 may be doped with impurities, and the channel region 112 may be disposed between the source region 114 and the drain region 116.

The gate insulation layer 120 may be disposed to cover the active pattern 110, and the gate electrode 125 may be disposed on the gate insulation layer 120. In example embodiments, the gate electrode 125 may overlap the channel region 112 of the active pattern 110.

The first insulating interlayer 130 may be disposed to cover the gate electrode 125, and the source electrode 132 and the drain electrode 134 may be electrically connected to the source region 114 and the drain region 116 through the first insulating interlayer 130 and the gate insulation layer 120. Further, the second insulating interlayer 140 may be disposed to cover the pixel circuit including the second transistor (Tr2). In example embodiments, the second insulating interlayer 140 may have an upper surface which is substantially flat.

The lower electrodes 152, 154 and 156 may be disposed on the second insulating interlayer 140. The lower electrodes 152, 154 and 156 may be disposed in the light emitting portions (I, II, III), respectively. The lower electrodes 152, 154 and 156 may include a transparent conductive material such as indium zinc oxide (IZO) or indium tin oxide (ITO).

The pixel defining layer 155 may be disposed on the second insulating interlayer 140 to partially cover the lower electrodes 152, 154 and 156. In example embodiments, the pixel defining layer 155 may include an organic insulation material or an inorganic insulation material such as silicon oxide or silicon nitride.

The hole transfer layer 160 may be disposed on the lower electrode 152, 154 and 156 and the pixel defining layer 155. In example embodiment, hole transfer layer 160 may be formed without using a mask or performing an etching process using an etching solution.

Organic light emitting layer patterns 182, 184 and 186 may be disposed on top surfaces of the lower electrodes 152, 154 and 156 and sidewalls of the pixel defining layer 155. In example embodiments, the organic light emitting layer patterns 182, 184 and 186 may have a thickness in a range of about 200 Å to about 500 Å.

Referring to FIGS. 36 and 37, the first organic light emitting layer pattern 182 may extend in the second direction, so that the first organic light emitting layer pattern 182 may overlap the plurality of first light emitting portions (I). The second organic light emitting layer pattern 184 may extend in the second direction, so that the first organic light emitting layer pattern 184 may overlap the plurality of second light emitting portions (II). The third organic light emitting layer pattern 186 may extend in the second direction, so that the third organic light emitting layer pattern 186 may overlap the plurality of third light emitting portions (III). Further, the first organic light emitting layer 182, the second organic light emitting layer pattern 184 and the third organic light emitting layer pattern 186 may be spaced apart from each other in the first direction.

As mentioned above, when viewed from the second direction, the first light emitting portion (I), the second light emitting portion (II), and the third light emitting portion (III) may not overlap the transmission portion (IV), so that the first organic light emitting layer 182, the second organic light emitting layer pattern 184, and the third organic light emitting layer pattern 186 may not overlap the transmission portion (IV). That is, external light passing through the transmission portion (IV) may not pass through the organic light emitting layer patterns 182, 184 and 186, so that transmittance of external light in the transmission portion (IV) may be increased, and a color shift problem due to the organic light emitting layer patterns 182, 184 and 186 may be prevented.

The upper electrode 170 may be disposed on the organic light emitting layer patterns 182, 184 and 186 and hole transfer layer 160. For example, the upper electrode 170 may include aluminum (Al), platinum (Pt), silver (Ag), magnesium (Mg), gold (Au), chromium (Cr), tungsten (W), molybdenum (Mo), titanium (Ti) or an alloy thereof. However, the upper electrode 170 may have a relatively thin thickness, so that the upper electrode 170 may have a relatively high transmittance.

According to example embodiments, the first organic light emitting layer 182, the second organic light emitting layer pattern 184, and the third organic light emitting layer pattern 186 may extend in the second direction. Further, when viewed from the second direction, the first light emitting portion (I), the second light emitting portion (II), and the third light emitting portion (III) may not overlap the transmission portion (IV). While transferring the substrate 100 in the second direction, each of the first organic light emitting layer 182, the second organic light emitting layer pattern 184, and the third organic light emitting layer pattern 186 may be formed not to overlap the transmission portion (IV). Therefore, transmittance of external light in the transmission portion (IV) may be increased, and a color shift problem due to the organic light emitting layer patterns 182, 184 and 186 may be prevented.

According to example embodiments, when viewed from the first direction, a first light emitting portion (I), a second light emitting portion (II) and a third light emitting portion (III) may not overlap a transmission portion (IV), so that a first organic light emitting layer, a second organic light emitting layer pattern and a third organic light emitting layer pattern may not overlap the transmission portion (IV). That is, an external light passing through the transmission portion (IV) may not pass through the organic light emitting layer patterns, so that transmittance of external light in the transmission portion (IV) may be increased, and a color shift problem due to the organic light emitting layer patterns may be prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display device, comprising:
a substrate having a first width in a first direction and a second width in a second direction substantially perpendicular to the first direction, the first width being greater than the second width;
a plurality of pixel regions on the substrate, each of the plurality of pixel regions being divided into a first region and a second region, each of the plurality of pixel regions including a first light emitting portion, a second light emitting portion, a third light emitting portion and a transmission portion arranged along the second direction, and each of the first light emitting portion, the second light emitting portion, and the third light emitting portion extending in the first direction;
a plurality of first lower electrodes in the first light emitting portions;
a plurality of second lower electrodes in the second light emitting portions;
a plurality of third lower electrodes in the third light emitting portions; and
an upper electrode,
wherein the first light emitting portion, the second light emitting portion, and the third light emitting portion are disposed in the first region of each of the pixel regions, and the transmission portion is disposed in the second region of each of the pixel regions, wherein
an organic light emitting layer is selectively formed in the first, second, and third light emitting portions among the first, second, and third light emitting portions and the transmission portion, wherein
the organic light emitting layer includes:
a first organic light emitting layer on the plurality of first lower electrodes, the first organic light emitting layer extending in the first direction,
a second organic light emitting layer on the plurality of second lower electrodes, the second organic light emitting layer extending in the first direction, and
a third organic light emitting layer on the plurality of third lower electrodes, the third organic light emitting layer extending in the first direction, wherein
the upper electrode is on the first organic light emitting layer, the second organic light emitting layer, and the third organic light emitting layer, and wherein
the upper electrode covers the first light emitting portions, the second light emitting portions, and the third light emitting portions, while exposing the transmission portions.

2. The organic light emitting display device as claimed in claim 1, wherein:
the first organic light emitting layer covers the first light emitting portions, and exposes the transmission portions,
the second organic light emitting layer covers the second light emitting portions, and exposes the transmission portions, and
the third organic light emitting layer covers the third light emitting portions, and exposes the transmission portions.

3. The organic light emitting display device as claimed in claim 1, wherein the upper electrode includes aluminum (Al), platinum (Pt), silver (Ag), magnesium (Mg), gold (Au), chromium (Cr), tungsten (W), molybdenum (Mo), titanium (Ti) or an alloy thereof.

4. The organic light emitting display device as claimed in claim 1, wherein the transmission portions do not overlap the first light emitting portion, the second light emitting portion, or the third light emitting portion in the first direction.

5. The organic light emitting display device as claimed in claim 1, wherein:
a length of the first light emitting portion in the first direction is substantially greater than a width of the first light emitting portion in the second direction,
a length of the second light emitting portion in the first direction is substantially greater than a width of the second light emitting portion in the second direction, and
a length of the third light emitting portion in the first direction is substantially greater than a width of the third light emitting portion in the second direction.

6. The organic light emitting display device as claimed in claim 1, wherein the organic light emitting display device is bendable about an axis extending in the second direction.

7. The organic light emitting display device as claimed in claim 1, wherein the first organic light emitting layer, the second organic light emitting layer, and the third light emitting layer are not disposed in the transmission portion.

8. The organic light emitting display device as claimed in claim 1, further comprising an organic layer covering the transmission portions, the organic layer having a relatively low adhesive characteristic with respect to the upper electrode.

9. The organic light emitting display device as claimed in claim 8, wherein the organic layer includes lithium quinoline.

10. The organic light emitting display device as claimed in claim 1, further comprising:
a first pixel circuit in the first light emitting portion, the first pixel circuit being electrically connected to the first lower electrode;
a second pixel circuit in the second light emitting portion, the second pixel circuit being electrically connected to the second lower electrode; and
a third pixel circuit in the third light emitting portion, the third pixel circuit being electrically connected to the third lower electrode.

11. The organic light emitting display device as claimed in claim 10, further comprising:
a driving circuit in an edge of the substrate; and
a plurality of wirings electrically connecting the driving circuit with the first pixel circuit, the second pixel circuit or the third pixel circuit.

12. The organic light emitting display device as claimed in claim 11, wherein the wirings include a scan line, a data line, and a Vdd line.

13. The organic light emitting display device as claimed in claim 12, wherein the scan line extends in the second direction, and the data line and the Vdd line extend in the first direction.

14. The organic light emitting display device as claimed in claim 12, wherein the scan line extends in the first direction, and the data line and the Vdd line extend in the second direction.

15. An organic light emitting display device, comprising:
a substrate having a first width in a first direction and a second width in a second direction substantially perpendicular to the first direction, the first width being greater than the second width;
a plurality of pixel regions on the substrate, each of the pixel regions being divided into a first region and a second region, each of the plurality of pixel regions including a first light emitting portion, a second light emitting portion, a third light emitting portion and a transmission portion arranged along the first direction, and each of the first emitting portion, the second emitting portion and the third emitting portion extending in the second direction;
a plurality of first lower electrodes in the first light emitting portions;
a plurality of second lower electrodes in the second light emitting portions;
a plurality of third lower electrodes in the third light emitting portions; and
an upper electrode,
wherein the first light emitting portion, the second light emitting portion, and the third light emitting portion are disposed in the first region of each of the pixel regions, and the transmission portion is disposed in the second region of each of the pixel regions, wherein
an organic light emitting layer is selectively formed in the first, second, and third light emitting portions among the first, second, and third light emitting portions and the transmission portion, wherein
the organic light emitting layer includes:
a first organic light emitting layer on the plurality of first lower electrodes, the first organic light emitting layer extending in the first direction,
a second organic light emitting layer on the plurality of second lower electrodes, the second organic light emitting layer extending in the first direction, and
a third organic light emitting layer on the plurality of third lower electrodes, the third organic light emitting layer extending in the first direction,
wherein the upper electrode is on the first organic light emitting layer, the second organic light emitting layer, and the third organic light emitting layer, and
wherein the upper electrode covers the first light emitting portions, the second light emitting portions, and the third light emitting portions, while exposing the transmission portions.

16. The organic light emitting display device as claimed in claim 15, wherein the first organic light emitting layer covers the first light emitting portions, and exposes the transmission portions,
wherein the second organic light emitting layer covers the second light emitting portions, and exposes the transmission portions, and
wherein the third organic light emitting layer covers the third light emitting portions, and exposes the transmission portions.

17. The organic light emitting display device as claimed in claim 15, wherein the transmission portions do not overlap the first light emitting portion, the second light emitting portion and the third light emitting portion in the second direction.

18. The organic light emitting display device as claimed in claim 15, wherein a length of the first light emitting portion in the second direction is substantially greater than a width of the first light emitting portion in the first direction,
wherein a length of the second light emitting portion in the second direction is substantially greater than a width of the second light emitting portion in the first direction, and
wherein a length of the third light emitting portion in the second direction is substantially greater than a width of the third light emitting portion in the first direction.

19. A method of manufacturing an organic light emitting display device, the method comprising:
providing a substrate having a first width in a first direction and a second width in a second direction substantially perpendicular to the first direction, the first width being greater than the second width;
defining a plurality of pixel regions on the substrate, each of the pixel regions including a first light emitting portion, a second light emitting portion, a third light emitting portion and a transmission portion arranged along the second direction;
forming a first organic light emitting layer extending in the first direction, the first organic light emitting layer overlapping the first light emitting portions;
forming a second organic light emitting layer extending in the first direction, the first organic light emitting layer overlapping the second light emitting portions; and
forming a third organic light emitting layer extending in the first direction, the first organic light emitting layer overlapping the third light emitting portions, wherein forming the first organic light emitting layer includes:
arranging a mask structure over a deposition apparatus, the mask structure including a plurality of openings, emitting deposition particles from the deposition apparatus by heating the deposition apparatus, and transferring the substrate above the mask structure in the first direction.

20. The method as claimed in claim 19, further comprising forming a plurality of first lower electrodes in the first light emitting portions, a plurality of second lower electrodes in the second light emitting portions and a plurality of third lower electrodes in the third light emitting portions, before forming the first organic light emitting layer.

21. The method as claimed in claim 19, further comprising forming an upper electrode on the first organic light emitting layer, the second organic light emitting layer and the third organic light emitting layer, after forming the third organic light emitting layer.

22. The method as claimed in claim 19, wherein the mask structure has the second width in the second direction.

23. The method as claimed in claim 19, after forming the third organic light emitting layer, further comprising:

forming an organic layer covering the transmission portion; and forming an upper electrode on the first organic light emitting layer, the second organic light emitting layer and the third organic light emitting layer, the upper electrode exposing the transmission portion.

24. The method as claimed in claim 23, wherein the organic layer includes lithium quinoline, and wherein the upper electrode includes aluminum (Al), platinum (Pt), silver (Ag), magnesium (Mg), gold (Au), chromium (Cr), tungsten (W), molybdenum (Mo), titanium (Ti) or an alloy thereof.

25. The method as claimed in claim 24, wherein the upper electrode does not overlap the organic layer, or overlaps an edge portion of the organic layer.

* * * * *